(12) United States Patent
Honda

(10) Patent No.: US 6,509,592 B2
(45) Date of Patent: Jan. 21, 2003

(54) FERROELECTRIC MEMORY

(75) Inventor: Toshiyuki Honda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 224 days.

(21) Appl. No.: 09/731,867

(22) Filed: Dec. 8, 2000

(65) Prior Publication Data

US 2002/0135068 A1 Sep. 26, 2002

(30) Foreign Application Priority Data

Dec. 9, 1999 (JP) .......................................... 11-349673

(51) Int. Cl.[7] ............................................ H01L 27/108
(52) U.S. Cl. ...................................................... 257/295
(58) Field of Search ................................. 257/315, 295

(56) References Cited

U.S. PATENT DOCUMENTS 5,696,394 A * 12/1997 Jones, Jr. et al.
6,301,145 B1 * 10/2001 Nishihara
6,429,080 B2 * 8/2002 Furukawa et al.
6,437,383 B1 * 8/2002 Xu

FOREIGN PATENT DOCUMENTS

EP  0504425  * 9/1992

* cited by examiner

Primary Examiner—Stephen D. Meler
(74) Attorney, Agent, or Firm—Nixon Peabody LLP; Donald R. Studebaker

(57) ABSTRACT

A ferroelectric memory includes a well region, which is defined in a semiconductor substrate and extends in a direction, a bit line also extending in the direction and a source line also extending in the direction. First, second and third memory cells are formed in this order on the well region and arranged in the direction. A first active region electrically connects the first memory cell and the bit line together. A second active region electrically connects the first memory cell and the source line together. A third active region electrically connects the second memory cell and the bit line together. A fourth active region electrically connects the second memory cell and the source line together. A fifth active region electrically connects the third memory cell and the bit line together. And a sixth active region electrically connects the third memory cell and the source line together. The first and third active regions are the same active region, and the fourth and sixth active regions are the same active region.

3 Claims, 26 Drawing Sheets

FERROELECTRIC MEMORY

BACKGROUND OF THE INVENTION

The present invention generally relates to a ferroelectric memory, and more particularly relates to a ferroelectric memory including field effect transistors (FETs). In each of the FETs, source/drain regions are defined and spaced apart from each other on the surface of a well region within a semiconductor substrate. And a gate electrode is also formed over a channel between the source/drain regions in the well with a ferroelectric gate insulating film interposed therebetween.

Hereinafter, a known ferroelectric memory of the type disclosed in Japanese Laid-Open Publication No. 8-3166440, for example, will be described with reference to FIGS. 21, 22, 23, 24 and 25. FIG. 21 illustrates an overall arrangement for a memory array in the known ferroelectric memory. FIG. 22 illustrates a planar layout for part of the memory array shown in FIG. 21, e.g., well contact region (1) and array block (1—1). FIG. 23 illustrates a planar layout obtained by removing the bit and source lines from the layout shown in FIG. 22. FIG. 24 illustrates a planar layout obtained by removing the word lines from the layout shown in FIG. 23. And FIG. 25 illustrates an equivalent circuit of the known ferroelectric memory.

As shown in FIG. 21, multiple array blocks are arranged to form a matrix, i.e., in a number m of rows and a number n of columns. The number m of array blocks, belonging to the same column, shares a single well region.

As shown in FIGS. 22, 23 and 24, multiple well regions 1, extending in one direction and in parallel to each other, are defined in a semiconductor substrate. In addition, multiple well isolating regions 2 are also defined to extend in the same direction and in parallel to each other. In this manner, each of the well regions 1 is electrically isolated from horizontally adjacent ones by the associated pair of well isolating regions 2. Also, on the surface of each well region 1, multiple element isolating regions (e.g., field oxide regions) 9 are defined at regular intervals.

As shown in FIG. 24, first and second active regions 7S and 7D (to be source/drain regions, respectively) are defined between adjacent ones of the element isolating regions 9 on the surface of each well region 1 with a channel region 8 interposed between these regions 7S and 7D. As shown in FIG. 22, the first active regions 7S, belonging to the same column, are electrically connected to a source line 5 of aluminum, for example, which extends over and along associated one of the well isolating regions 2. In the same way, the second active regions 7D, belonging to the same column, are electrically. connected to a bit line 4 of aluminum, for example, which also extends over and along associated one of the well isolating regions 2.

As shown in FIG. 24, the channel region 8 is located between each pair of (i.e., first and second) active regions 7S and 7D. Although not shown, a gate electrode is formed over the channel region 8 with a gate ferroelectric insulating thin film (which will be herein referred to simply as a "ferroelectric gate insulating film") interposed therebetween. A word line 3, which extends over the well and well isolating regions 1 and 2 vertically to these regions 1 and 2, is electrically connected to the gate electrodes on the same row. It should be noted that a ferroelectric thin film, which has been formed in the same process step as the gate insulating film for MFSFETs (metal ferroelectric semiconductor FETs) 6, is interposed between these well and well isolating regions 1, 2 and the word line 3.

In this manner, MFSFETs 6, each being made up of the first and second active regions 7S and 7D, channel region 8, gate insulating film and gate electrode, are formed at intersections between each word line 3 and the respective well regions 1. As used herein, the MFSFET 6 is a field effect transistor including a ferroelectric gate insulating film.

Also, a well contact region 10 is provided on the surface of one end (e.g., the lower end) of each well region 1 and is electrically connected to an associated source line 5.

In the known ferroelectric memory, when data is written on an MFSFET 6 (i.e., one of the memory cells making up one of the number m of array blocks on the same column), a voltage is applied to the source line 5 provided in common for the number m of array blocks on the same column. In this case, the voltage, applied through the source line 5 to the well region 1, should travel all the way from the well contact region 10 to the MFSFET 6, on which data should be written, over a distance corresponding to an associated number of array blocks. Accordingly, an electric field, which has an intensity at least equivalent to the coercive force of the ferroelectric gate insulating film, is applied between the well region 1 and the gate electrode of the MFSFET 6 on which the data should be written. As a result, the ferroelectric thin film for the MFSFET 6 in question is reversed in polarization direction and the data can be written on the MFSFET 6 as intended.

In the known ferroelectric memory, the element isolating regions 9 are formed on the surface of each well region 1 at regular intervals. In addition, the first and second active regions 7S and 7D, which will be source and drain regions, respectively, are also defined between adjacent ones of the isolating regions 9 on the surface of each well region 1. Accordingly, the array of memory cells cannot have its total area reduced sufficiently.

Furthermore, the voltage, applied to the source line 5, should travel along a long path indicated by the broken line in FIG. 26. That is to say, the voltage must go all the way from the well contact region 10, which is far way from the MFSFET 6 where data should be written, to the well region 1 for the MFSFET 6. In addition, the resistance of the region to which the voltage is applied (i.e., the resistance of the well region 1) is higher than that of the aluminum lines or those of the active regions.

For that reason, it takes a long time for the voltage applied to the well contact region 10 to reach the well region 1 for the MFSFET 6 on which data should be written. That is to say, the write time is too long.

SUMMARY OF THE INVENTION

A first object of the present invention is reducing the total area of an array of memory cells.

A second object of the present invention is shortening the time needed to write data on an arbitrary MFSFET.

To achieve the first object, a first inventive ferroelectric memory includes: a well region, which is defined in a semiconductor substrate and extends in a direction; a bit line also extending in the direction; a source line also extending in the direction; first, second and third memory cells, which are formed in this order on the well region and arranged in the direction; a first active region for electrically connecting the first memory cell and the bit line together; a second active region for electrically connecting the first memory cell and the source line together; a third active region for electrically connecting the second memory cell and the bit line together; a fourth active region for electrically connecting the second memory cell and the source line together; a fifth active region for electrically connecting the third memory cell and the bit line together; and a sixth active region for electrically connecting the third memory cell and the source line together. In the memory, the first and third active regions are the same active region, and the fourth and sixth active regions are the same active region.

In the first inventive ferroelectric memory, the first active region for electrically connecting the first memory cell and the bit line together can be the same as the third active region for electrically connecting the second memory cell and the bit line together. In addition, the fourth active region for electrically connecting the second memory cell and the source line together can be the same as the sixth active region for electrically connecting the third memory cell and the source line together. That is to say, no isolating region is needed between the first and third active regions or between the fourth and sixth active regions. Accordingly, the length of a memory array as measured along the bit line can be reduced, and the overall area of the array can also be reduced considerably.

To achieve the second object, a second inventive ferroelectric memory includes: a well region, which is defined in a semiconductor substrate and extends in a direction; a source line also extending in the direction; and a plurality of well contact regions, which are formed discretely on the surface of the well region and electrically connect the well region and the source line together.

In the second inventive ferroelectric memory, multiple well contact regions are formed discretely on the surface of a single well region. Thus, compared to the known arrangement where a well contact region is formed outside of a memory array, it takes a much shorter time for a voltage applied to the source line to reach the well region of a target memory cell on which data should be written. Accordingly, the data can be written on the desired memory cell in a much shorter time.

To achieve the first and second objects, a third inventive ferroelectric memory includes: a well region of a first conductivity type, which is defined in a semiconductor substrate and extends in a direction; a source line also extending in the direction; an active region of a second conductivity type, which is formed as a source region on the surface of the well region; and a well contact region of the first conductivity type, which is formed on the surface of the well region. In the third memory, the active region and the well contact region are located adjacent to each other and connected to the source line via a single contact.

In the third inventive ferroelectric memory, an active region of a second conductivity type, which will be a source region, and a well contact region of a first conductivity type are located adjacent to each other. That is to say, no isolating region is provided between the active and well contact regions. Accordingly, the length of a memory array as measured along the bit line can be reduced, and the total area of the array can also be reduced considerably.

In addition, the active and well contact regions are not only located adjacent to each other but also connected to the source line via a single contact. Thus, compared to the known arrangement where a well contact region is formed outside of a memory array, it takes a much shorter time for a voltage applied to the source line to reach the well region of a target memory cell on which data should be written. Accordingly, the data can be written on the desired memory cell in a much shorter time.

DESCRIPTION OF THE PREFERRED EMBODIMENTS

Embodiment 1

Figure 1:
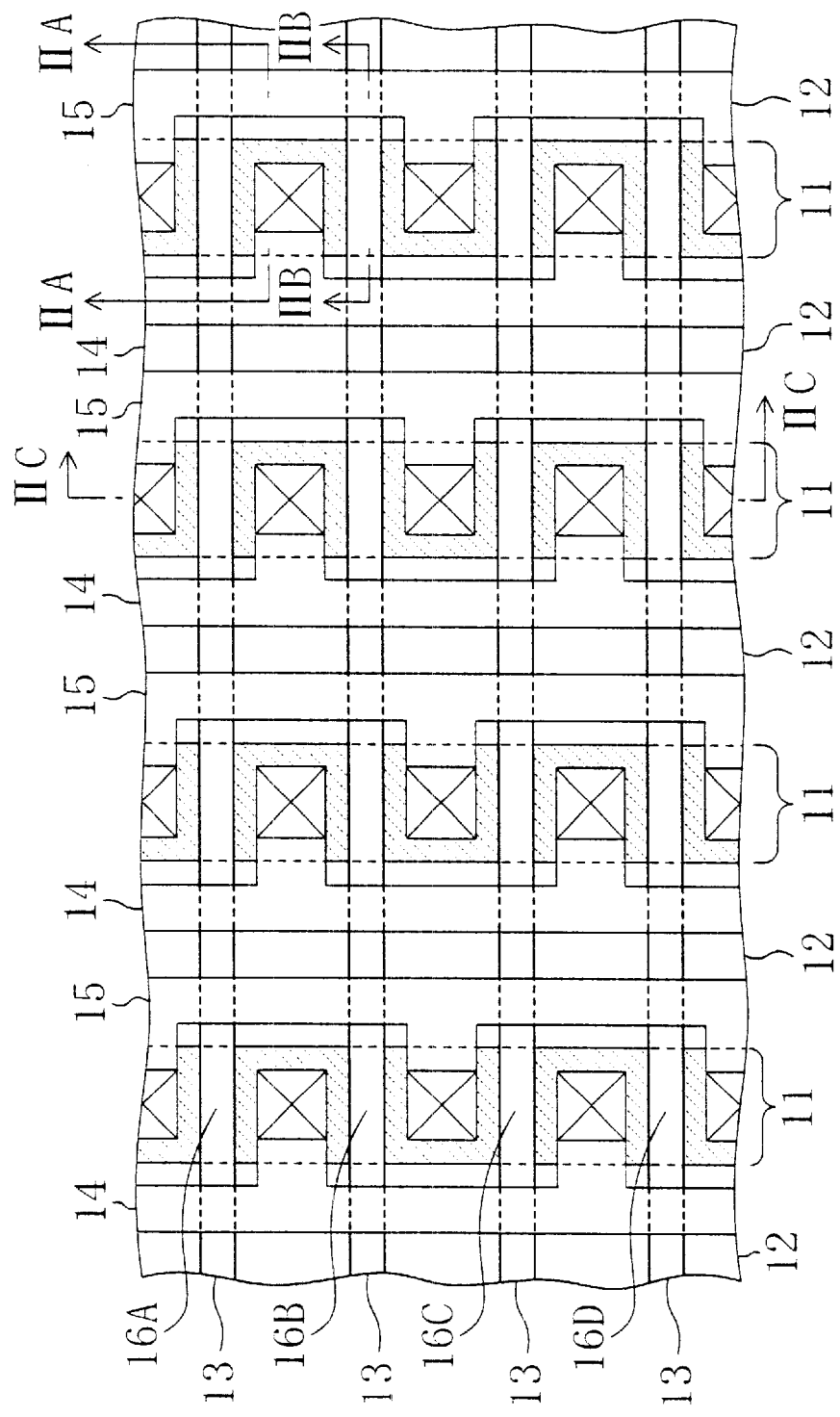
FIG. 1 is a plan view illustrating a layout for part of a memory array in a ferroelectric memory according to a first embodiment of the present invention.
Figure 2A:
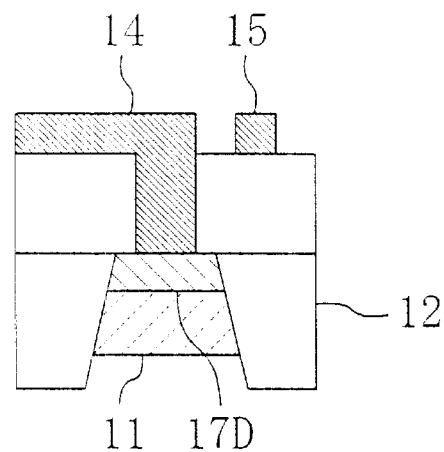
FIGS. 2A, 2B and 2C are cross-sectional views taken along the lines IIA—IIA, IIB—IIB and IIC—IIC shown in FIG. 1, respectively.
Figure 2B:
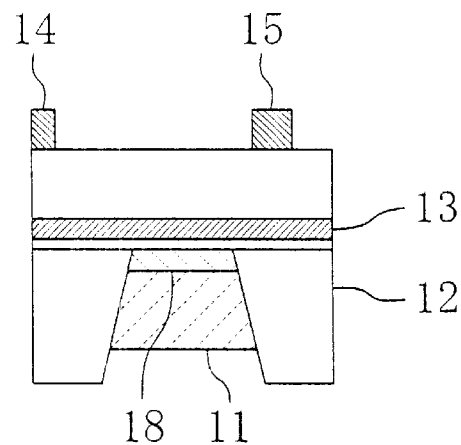
Figure 2C:
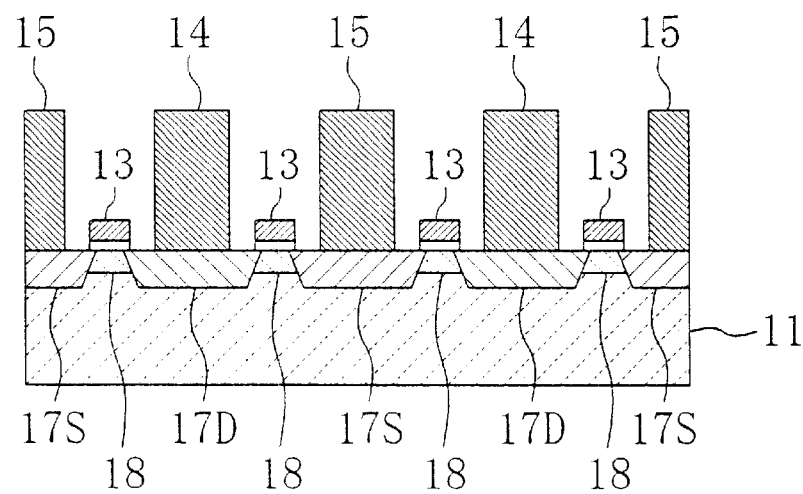
Figure 3:
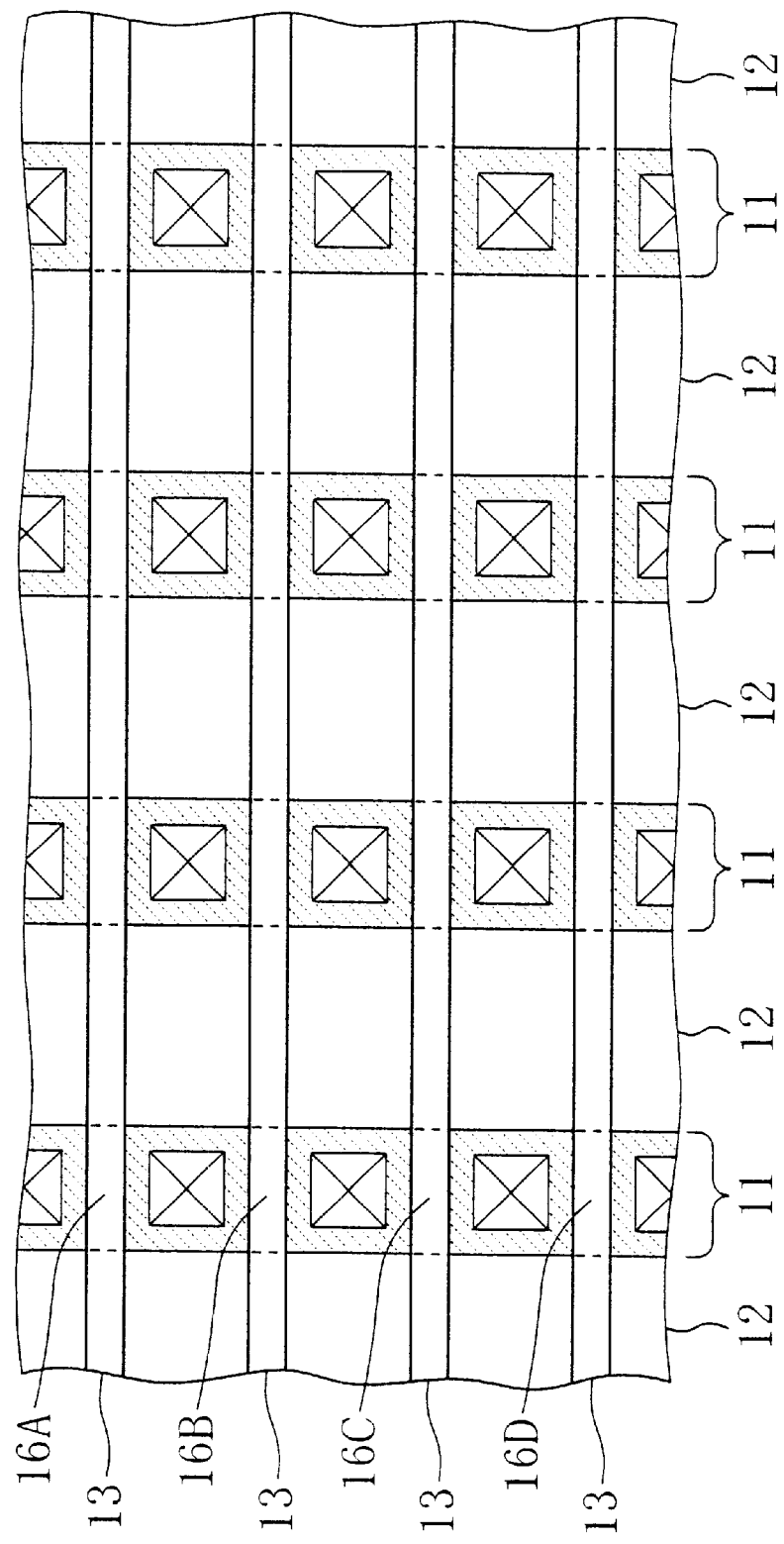
FIG. 3 is a plan view illustrating a layout obtained by removing the bit and source lines from the layout shown in FIG. 1.
Figure 4:
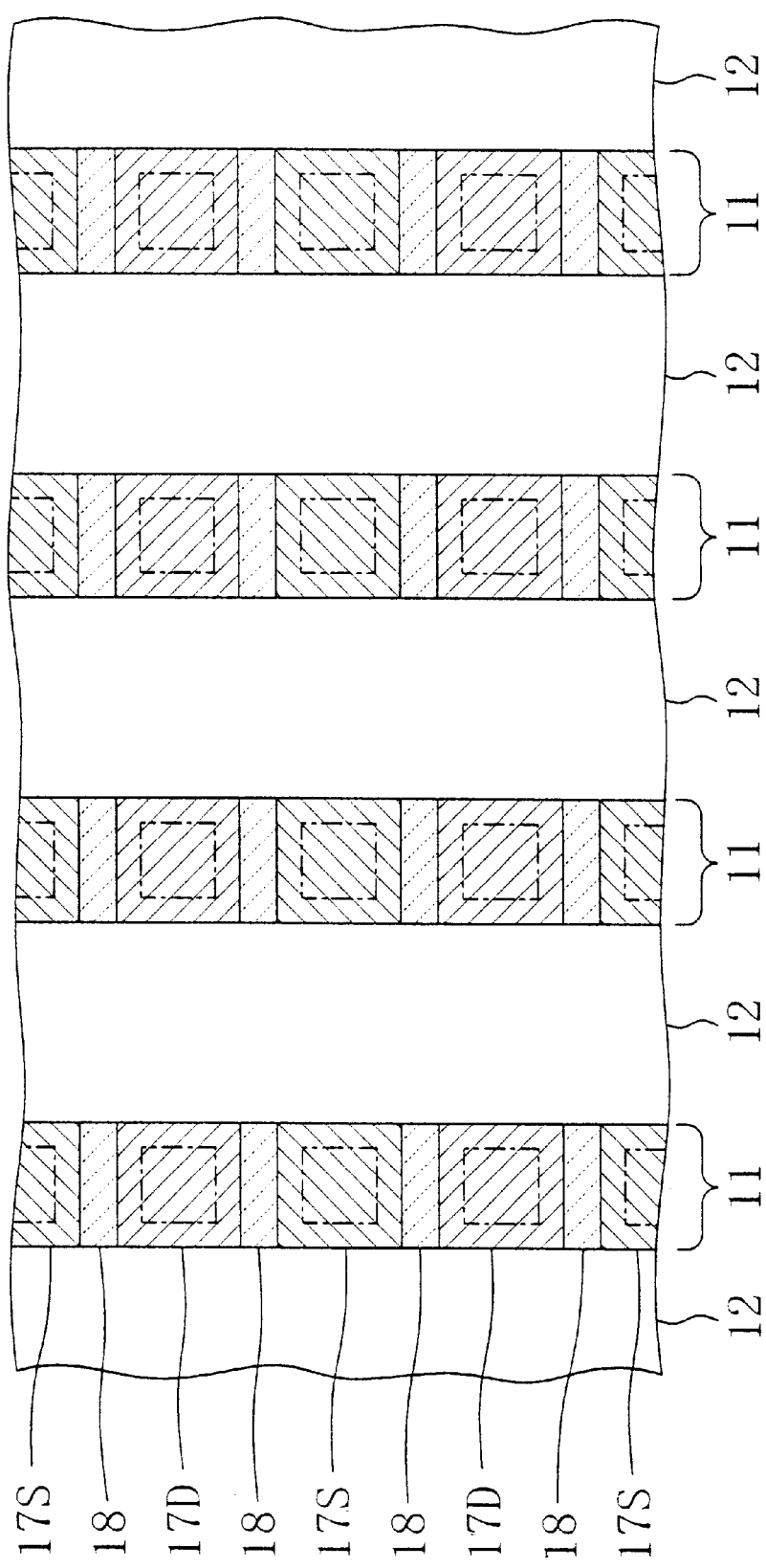
FIG. 4 is a plan view illustrating a layout obtained by removing the word lines from the layout shown in FIG. 3.
Figure 25:
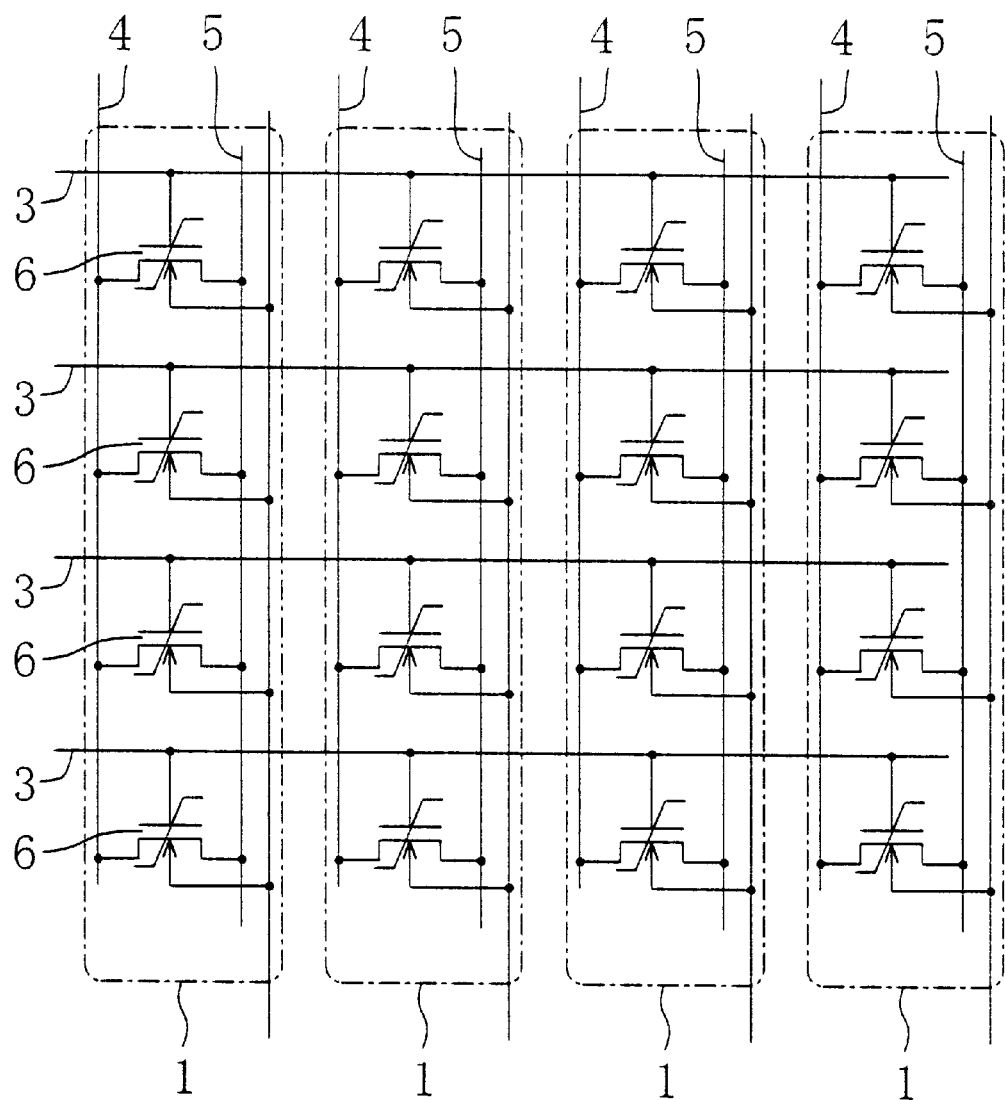
FIG. 25 illustrates an equivalent circuit for the known ferroelectric memory and ferroelectric memories according to the first through third embodiments of the present invention.
Figure 26:
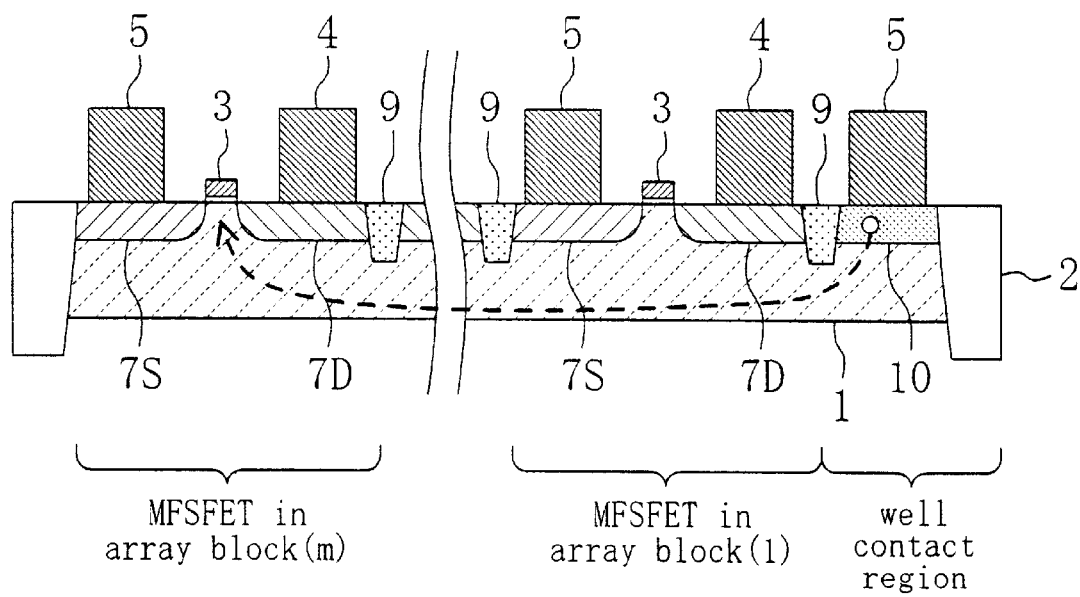
FIG. 26 is a cross-sectional view illustrating a problem of the known ferroelectric memory.

Hereinafter, a ferroelectric memory according to a first embodiment of the present invention will be described with reference to FIGS. 1, 2A, 2B, 2C, 3 and 4. FIG. 1 illustrates a planar layout for part of a memory array in the ferroelectric memory of the first embodiment. FIGS. 2A, 2B and 2C illustrate cross-sectional structures taken along the lines IIA—IIA, IIB—IIB and IIC—IIC shown in FIG. 1, respectively. FIG. 3 illustrates a planar layout obtained by removing the bit and source lines from the layout shown in FIG. 1. And FIG. 4 illustrates a planar layout obtained by removing the word lines from the layout shown in FIG. 3. It should be noted that the equivalent circuit of the ferroelectric memory of the first embodiment is the same as that of the known memory illustrated in FIG. 25.

As shown in FIGS. 1, 3 and 4, multiple well regions 11, extending in one direction and in parallel to each other, are defined in a semiconductor substrate. In addition, multiple well isolating regions 12 are also defined to extend in the same direction and in parallel to each other. In this manner, each of the well regions 11 is electrically isolated from horizontally adjacent ones by the associated pair of well isolating regions 12.

As shown in FIGS. 2A, 2B, 2C and 4, first and second active regions 17S and 17D to be source and drain regions, respectively, are defined on the surface of each well region 11. Each pair of active regions 17S and 17D are spaced apart from each other with a channel region 18 interposed therebetween. As shown in FIG. 1, the first active regions 17S, belonging to the same column, are electrically connected to a source line of aluminum, for example, which extends over and along associated one of the well isolating regions 12, via source line contacts. In the same way, the second active regions 17D, belonging to the same column, are electrically connected to a bit line 14 of aluminum, for example, which also extends over and along associated one of the well isolating regions 12, via bit line contacts.

A gate electrode is formed over each channel region 18, which is located between associated pair of first and second active regions 17S and 17D, with a ferroelectric gate insulating film interposed therebetween. And a word line 13, which extends over the well and well isolating regions 11 and 12 vertically to these regions 11 and 12, is electrically connected to the gate electrodes, belonging to the same row, via word line contacts.

As shown in FIGS. 1 and 3, first, second, third and fourth MFSFETs 16A, 16B, 16C and 16D are formed at intersections between the word lines 13 and each well region 11.

In the first embodiment, the first through fourth MFSFETs 16A through 16D, which use the same well region 11 in common and are adjacent to each other, share the first or second active region 17S or 17D and are not isolated from each other by isolating regions like STI or LOCOS. More specifically, the first and second MFSFETs 16A and 16B share a second active region 17D, the third and fourth MFSFETs 16C and 16D share another second active region 17D and the second and third MFSFETs 16B and 16C share a first active region 17S.

In this manner, according to the first embodiment, the first through fourth MFSFETs 16A through 16D, which use the same well region 11 in common and are adjacent to each other, share the active regions to be source/drain regions and are not isolated from each other by any isolating regions. Thus, the total area of the memory array can be reduced.

A ferroelectric insulating thin film, which is formed in the same process step as the gate insulating film for the S first through fourth MFSFETs 16A through 16D, is interposed between the well and well isolating regions 11, 12 and the word lines 13. However, the insulating film does not have to be formed over the well isolating regions 12.

It should be noted that the level relationship among the word, bit and source lines 13, 14 and 15 is not limited to the illustrated one.

In the first embodiment, a single MFSFET constitutes a single memory cell. Alternatively, as disclosed in Japanese Laid-Open Publication No. 5-120866, the ferroelectric memory may include a serial connection of an MFSFET, using a ferroelectric gate insulating film, and a MOSFET, not using the ferroelectric gate insulating film. As another alternative, the ferroelectric memory may also include MFSFETs, using the ferroelectric gate insulating film, and diodes as disclosed in Japanese Laid-Open Publication No. 5-129615. Furthermore, the ferroelectric memory may include split-gate transistors.

Embodiment 2

Figure 5:
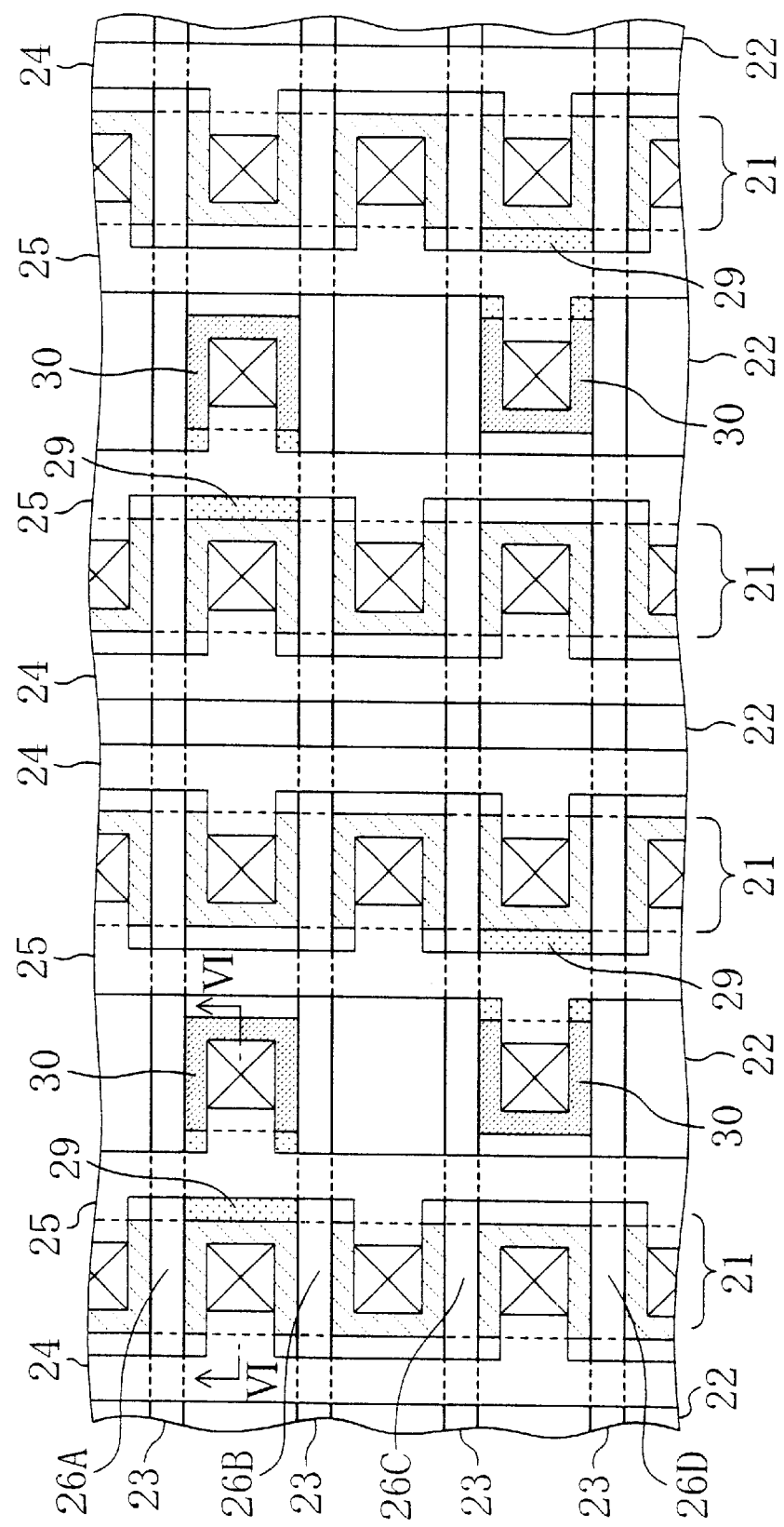
FIG. 5 is a plan view illustrating a layout for part of a memory array in a ferroelectric memory according to a second embodiment of the present invention.
Figure 6:
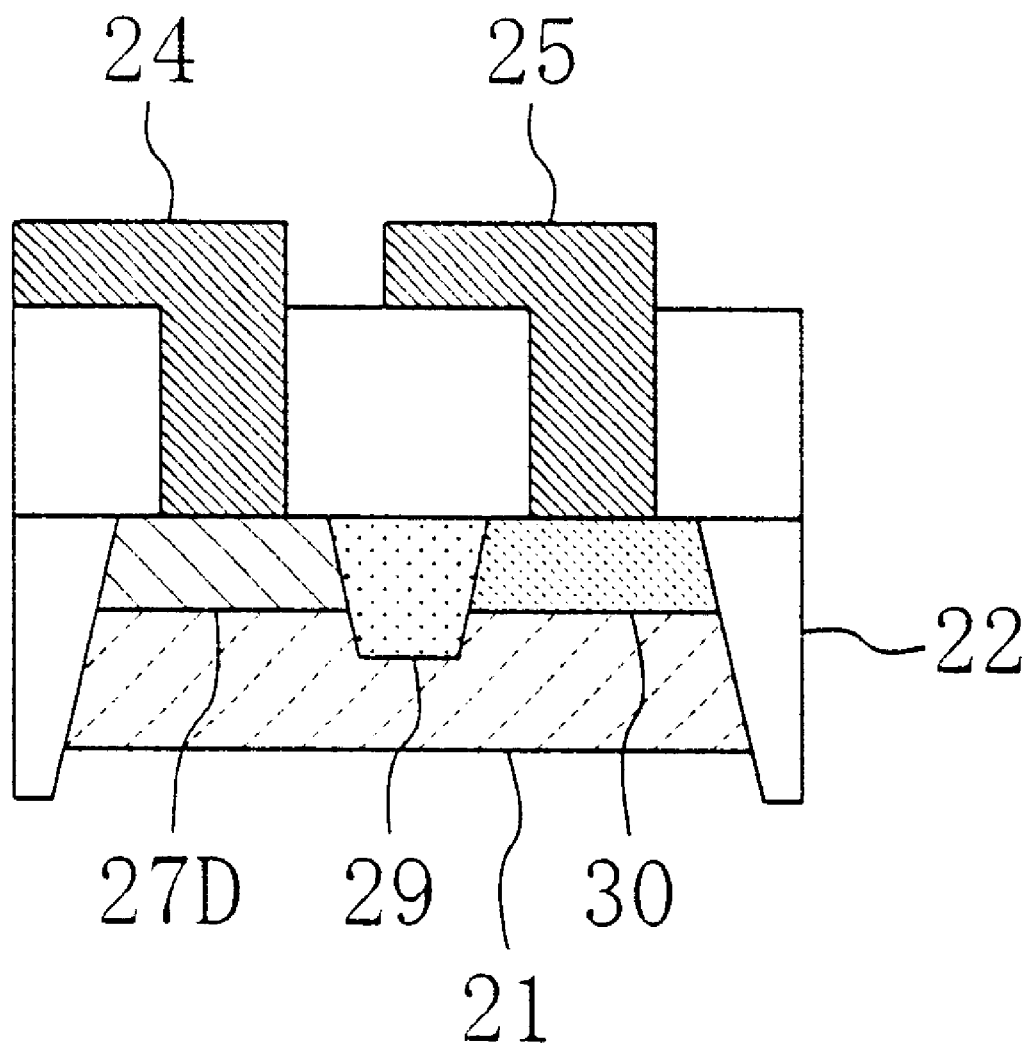
FIG. 6 is a cross-sectional view taken along the line VI—VI shown in FIG. 5.
Figure 7:
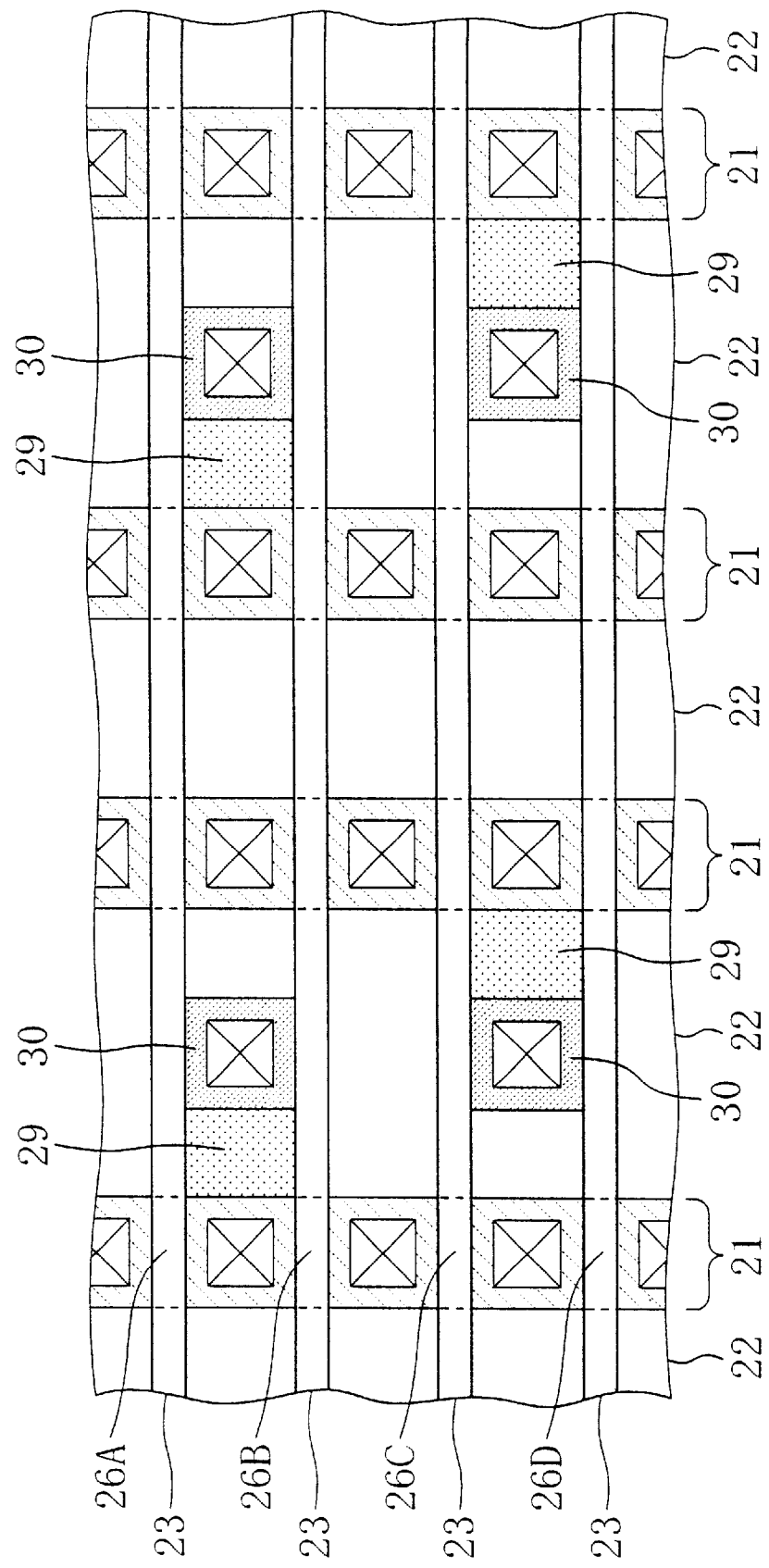
FIG. 7 is a plan view illustrating a layout obtained by removing the bit and source lines from the layout shown in FIG. 5.
Figure 8:
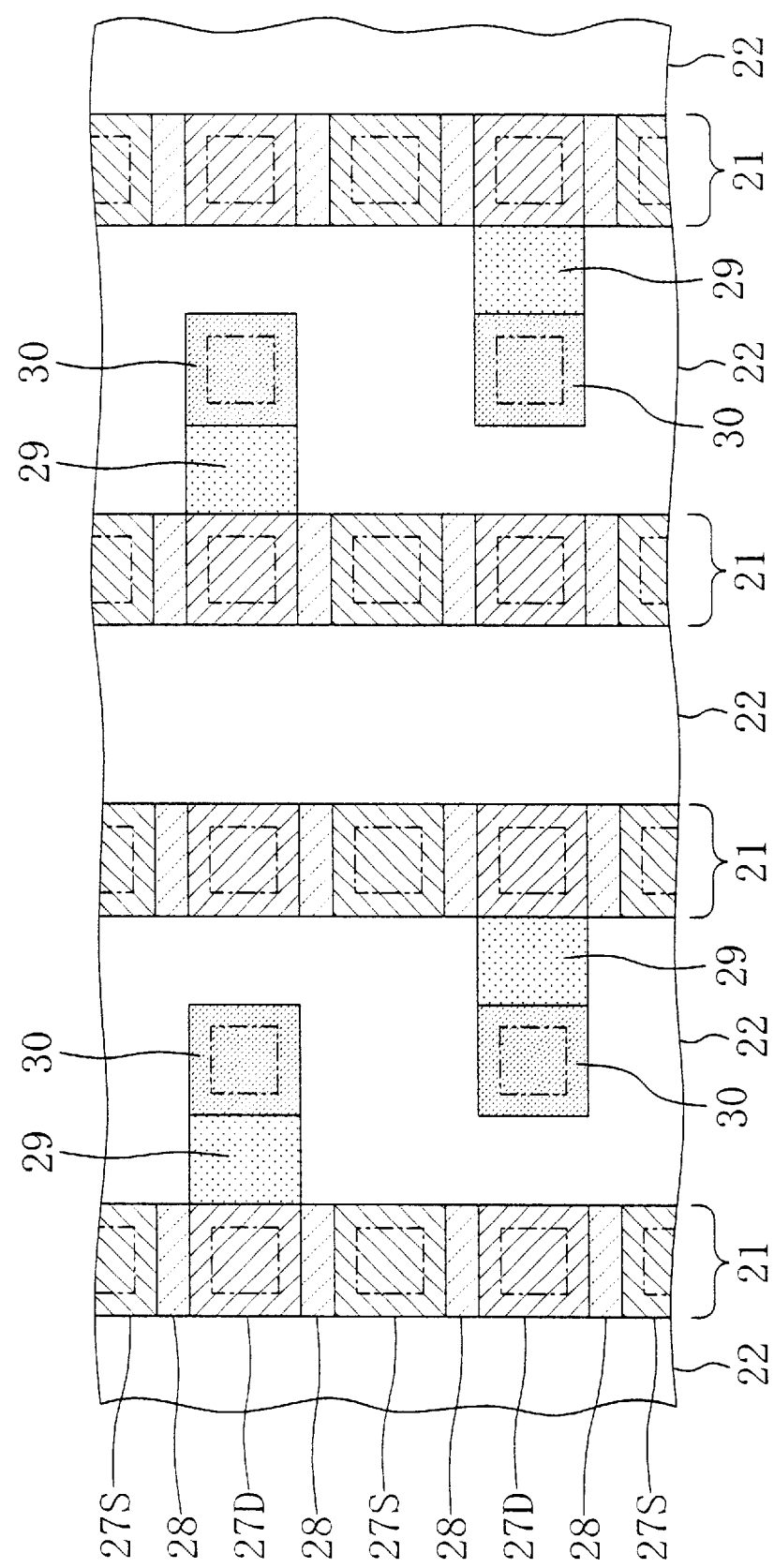
FIG. 8 is a plan view illustrating a layout obtained by removing the word lines from the layout shown in FIG. 7.

Hereinafter, a ferroelectric memory according to a second embodiment of the present invention will be described with reference to FIGS. 5, 6, 7 and 8. FIG. 5 illustrates a planar layout for part of a memory array in the ferroelectric memory of the second embodiment. FIG. 6 illustrates a cross-sectional structure taken along the line VI—VI shown in FIG. 5. FIG. 7 illustrates a planar layout obtained by removing the bit and source lines from the layout shown in FIG. 5. And FIG. 8 illustrates a planar layout obtained by removing the word lines from the layout shown in FIG. 7. It should be noted that the equivalent circuit of the ferroelectric memory of the second embodiment is the same as that of the known memory illustrated in FIG. 25.

As shown in FIGS. 5, 7 and 8, multiple well regions 21, extending in one direction and in parallel to each other, are defined in a semiconductor substrate. In addition, multiple well isolating regions 22 are also defined to extend in the same direction and in parallel to each other. In this manner, each of the well regions 21 is electrically isolated from horizontally adjacent ones by the associated pair of well isolating regions 22.

As shown in FIGS. 6 and 8, first and second active regions 27S and 27D to be source and drain regions, respectively, are defined on the surface of each well region 21. Each pair of active regions 27S and 27D are spaced apart from each other with a channel region 28 interposed therebetween. As shown in FIG. 6, the first active regions 27S, belonging to the same column, are electrically connected to a source line 25 of aluminum, for example, which extends over and along associated one of the well isolating regions 22, via source line contacts. In the same way, the second active regions 27D, belonging to the same column, are electrically connected to a bit line 24 of aluminum, for example, which also extends over and along associated one of the well isolating regions 22, via bit line contacts.

A gate electrode is formed over each channel region 28, which is located between the associated pair of first and second active regions 27S and 27D, with a ferroelectric gate insulating film interposed therebetween. And a word line 23, which extends over the well and well isolating regions 21 and 22 vertically to these regions 21 and 22, is electrically connected to the gate electrodes, belonging to the same row, via word line contacts.

A ferroelectric insulating thin film, which is formed in the same process step as the gate insulating film for MFSFETs 26, is interposed between the well and well isolating regions 21, 22 and the word lines 23. However, the insulating film does not have to be formed over the well isolating regions 22.

As shown in FIGS. 5 and 7, first, second, third and fourth MFSFETs 26A, 26B, 26C and 26D are formed at intersections between the word lines 23 and each well region 21.

In the second embodiment, each well region 21 includes extended regions, which extend vertically to the source lines 25 and are provided at regular intervals, and a well contact region 30 is defined on each extended region. Also, each well contact region 30 and an associated second active region 27D are isolated from each other by an element isolating region 29. Accordingly, the well contact region 30 is electrically connected to the well region 21 but isolated from the second active region 27D. Also, the well contact region 30 is connected to the source line 25 via a well contact.

In the second embodiment, where data should be written on one of the first through fourth MFSFETs 26A through 26D, a voltage is applied through the source line 25 to the well and channel regions 21 and 28 by way of the well contact regions 30. Then, an electric field, having an intensity at least equivalent to the coercive force of the ferroelectric gate insulating film, is applied between the channel regions 28 and the word lines 23 so that the polarization direction of the ferroelectric thin film is reversed. As a result, the data will be written on the MFSFET that includes the gate insulating film with the reversed polarization direction.

In the second embodiment, a voltage is applied through the source line 25 to the well region 21 via the multiple well contact regions 30. Accordingly, the distance between the well region 21 of the MFSFET, on which data should be written, and the nearest one of the well contact regions can be shortened. As a result, it takes a shorter time to write the data on the MFSFET.

Modified Example of Embodiment 2

Figure 9:
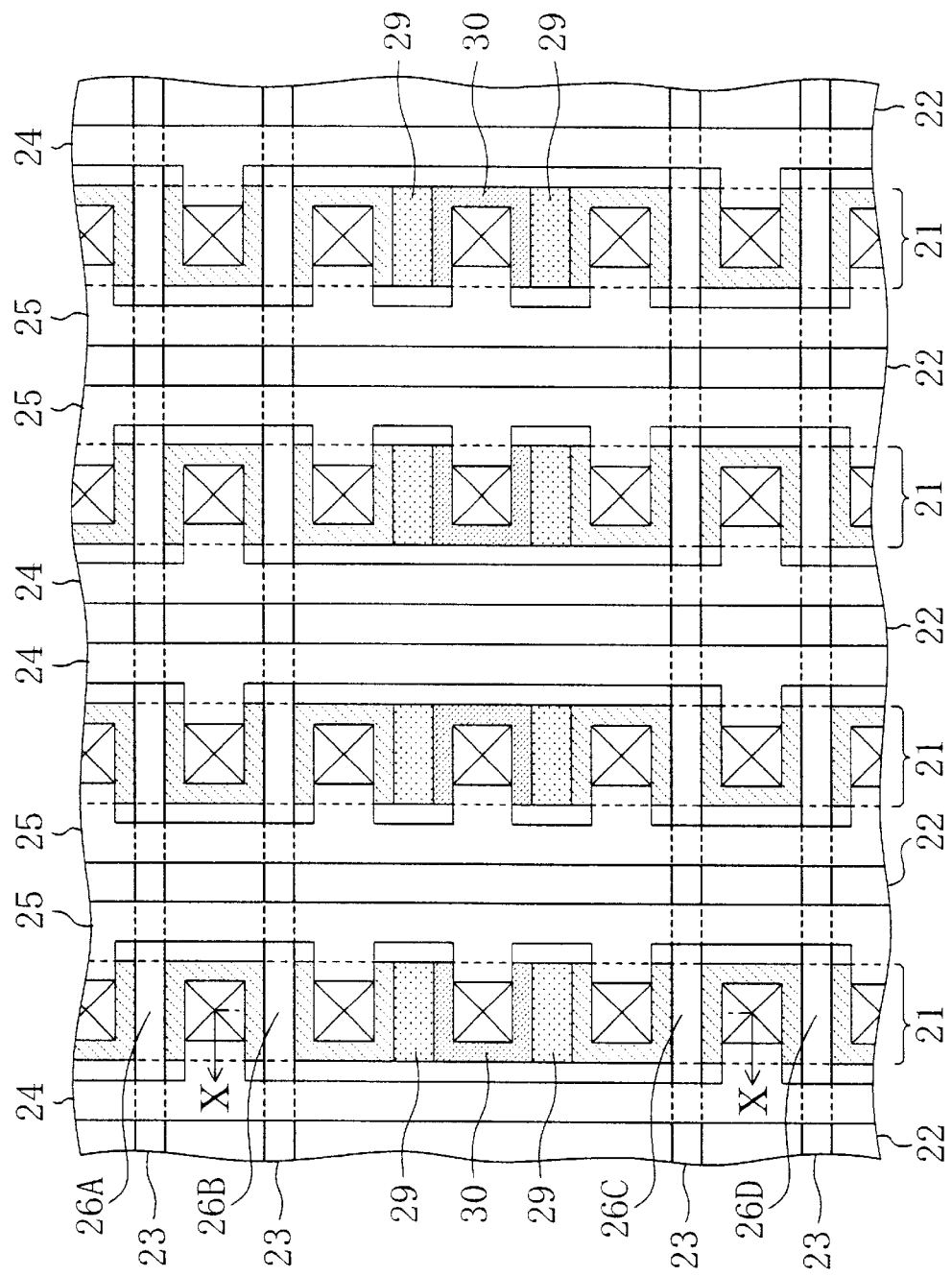
FIG. 9 is a plan view illustrating a layout for part of a memory array in a ferroelectric memory according to a modified example of the second embodiment.
Figure 10:
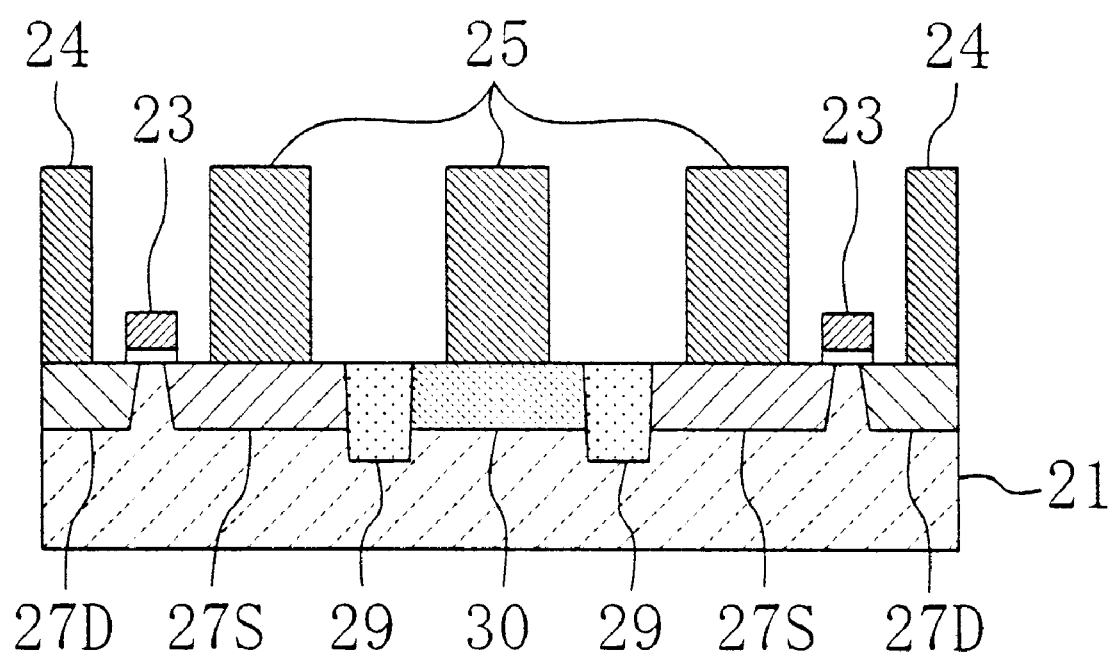
FIG. 10 is a cross-sectional view taken along the line X—X shown in FIG. 9.
Figure 11:
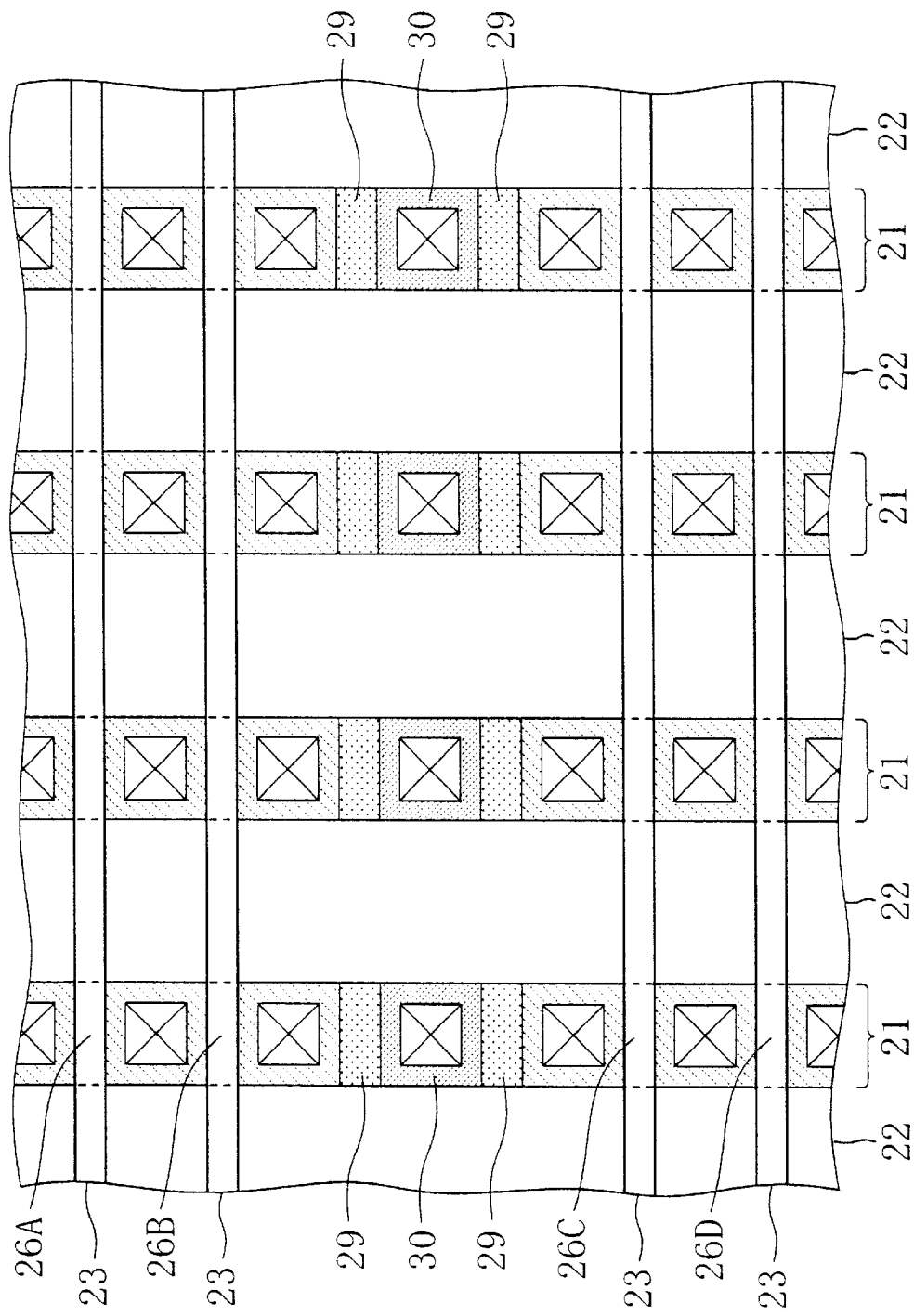
FIG. 11 is a plan view illustrating a layout obtained by removing the bit and source lines from the layout shown in FIG. 9.
Figure 12:
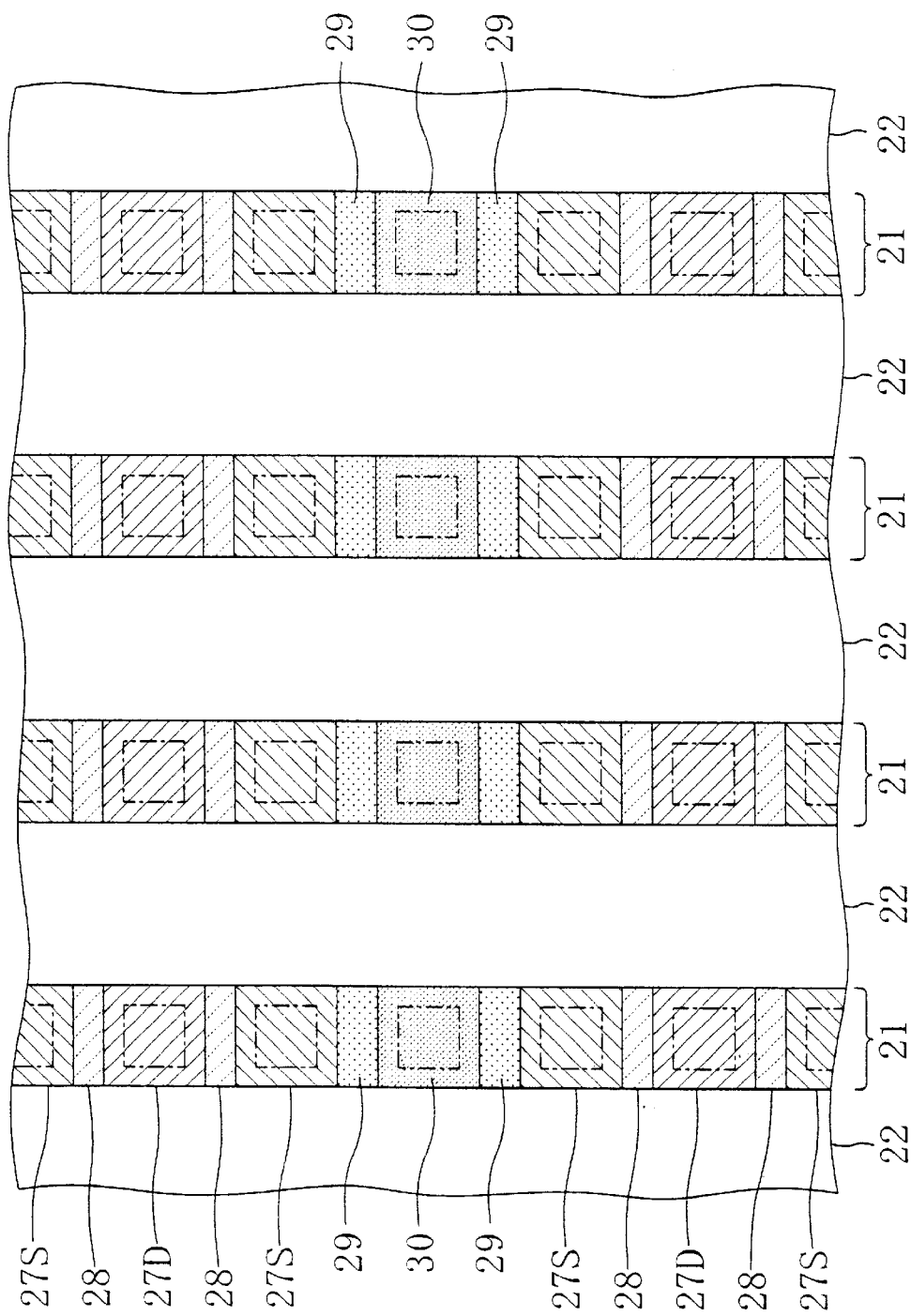
FIG. 12 is a plan view illustrating a layout obtained by removing the word lines from the layout shown in FIG. 11.

Hereinafter, a ferroelectric memory according to a modified example of the second embodiment will be described with reference to FIGS. 9, 10, 11 and 12. FIG. 9 illustrates a planar layout for part of a memory array in the ferroelectric memory of this modified example. FIG. 10 illustrates a cross-sectional structure taken along the line X—X shown in FIG. 9. FIG. 11 illustrates a planar layout obtained by removing the bit and source lines from the layout shown in FIG. 9. And FIG. 12 illustrates a planar layout obtained by removing the word lines from the layout shown in FIG. 11. In this modified example, the same components as the counter-parts of the second embodiment will be identified by the same reference numerals and the description thereof will be omitted herein.

In this modified example, each well contact region 30 is provided between two adjacent ones of the first active regions 27S on the surface of the well region 21, and is isolated from the first active regions 27S by the element isolating regions 29. Accordingly, the well contact region 30 is connected to the well region 21 but is isolated from the first active regions 27S. Also, the well contact region 30 is connected to the source line 25 via a well contact.

In this modified example, where data should be written on one of the first through fourth MFSFETs 26A through 26D, a voltage is also applied through the source line 25 to the well and channel regions 21 and 28 via the well contact regions 30. Then, an electric field, having an intensity at least equivalent to the coercive force of the ferroelectric gate insulating film, is applied between the channel regions 28 and the word lines 23 so that the polarization direction of the ferroelectric thin film is reversed. As a result, the data will be written on the MFSFET that includes the gate insulating film with the reversed polarization direction.

In this modified example, a voltage is applied through the source line 25 to the well region 21 via the multiple well contact regions 30. Accordingly, the distance between the well region 21 of the MFSFET, on which data should be written, and the nearest one of the well contact regions 30 can be shortened. As a result, it takes a shorter time to write the data on the MFSFET.

In the second embodiment, each well region 21 includes the extended regions that extend vertically to the source lines 25 and the well contact regions 30 are defined in the extended regions. That is to say, the well contact regions 30 extend from the second active regions 27S along the word lines 23. Accordingly, the resultant memory array will have its length increased in the direction in which the word lines 23 extend. In this modified example on the other hand, each of the well contact regions 30 is defined between adjacent ones of the first active regions 27S. Thus, the resultant memory array will have its length increased in the direction in which the bit lines 24 extend.

Embodiment 3

Figure 13:
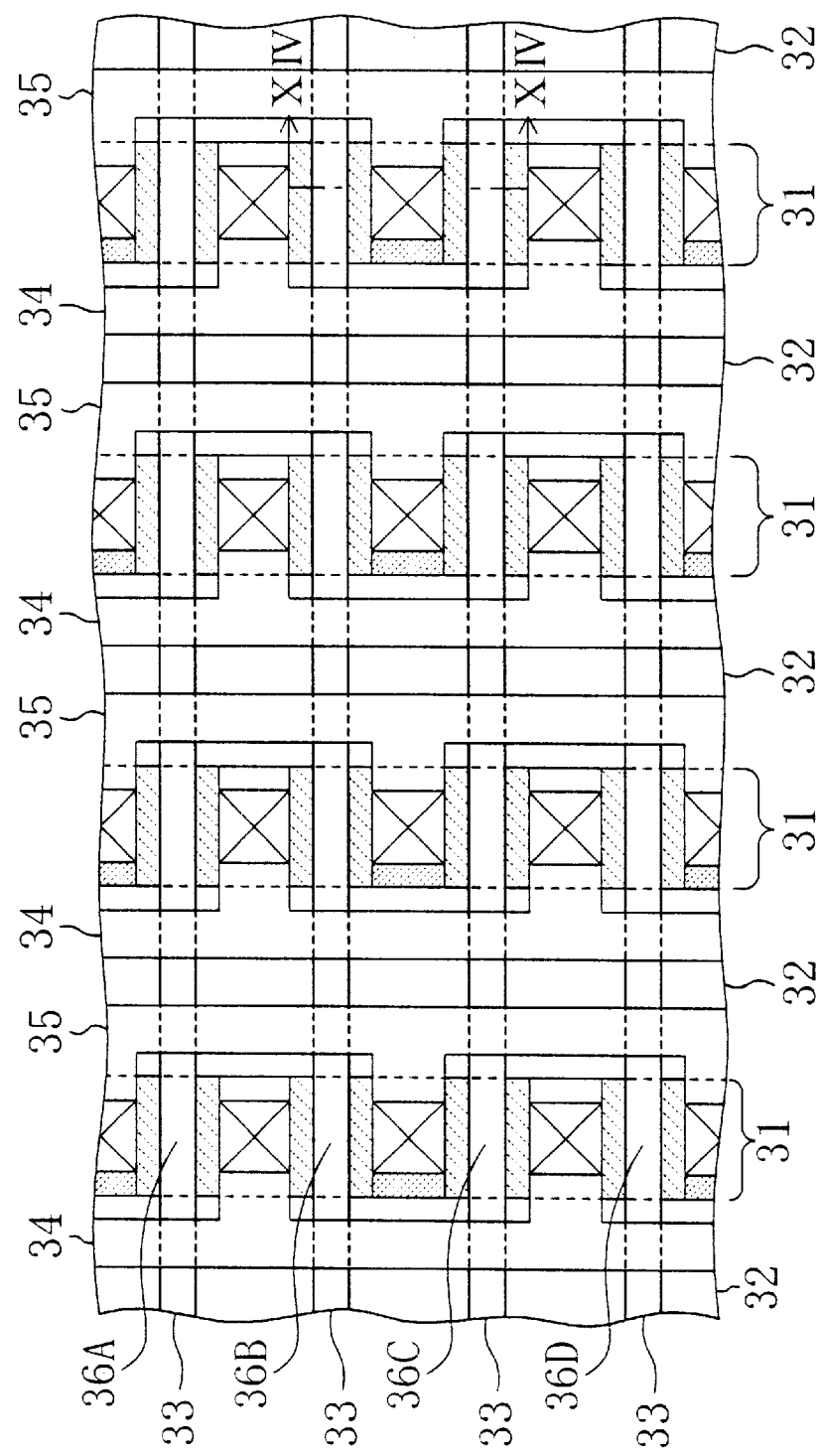
FIG. 13 is a plan view illustrating a layout for part of a memory array in a ferroelectric memory according to a third embodiment of the present invention.
Figure 14:
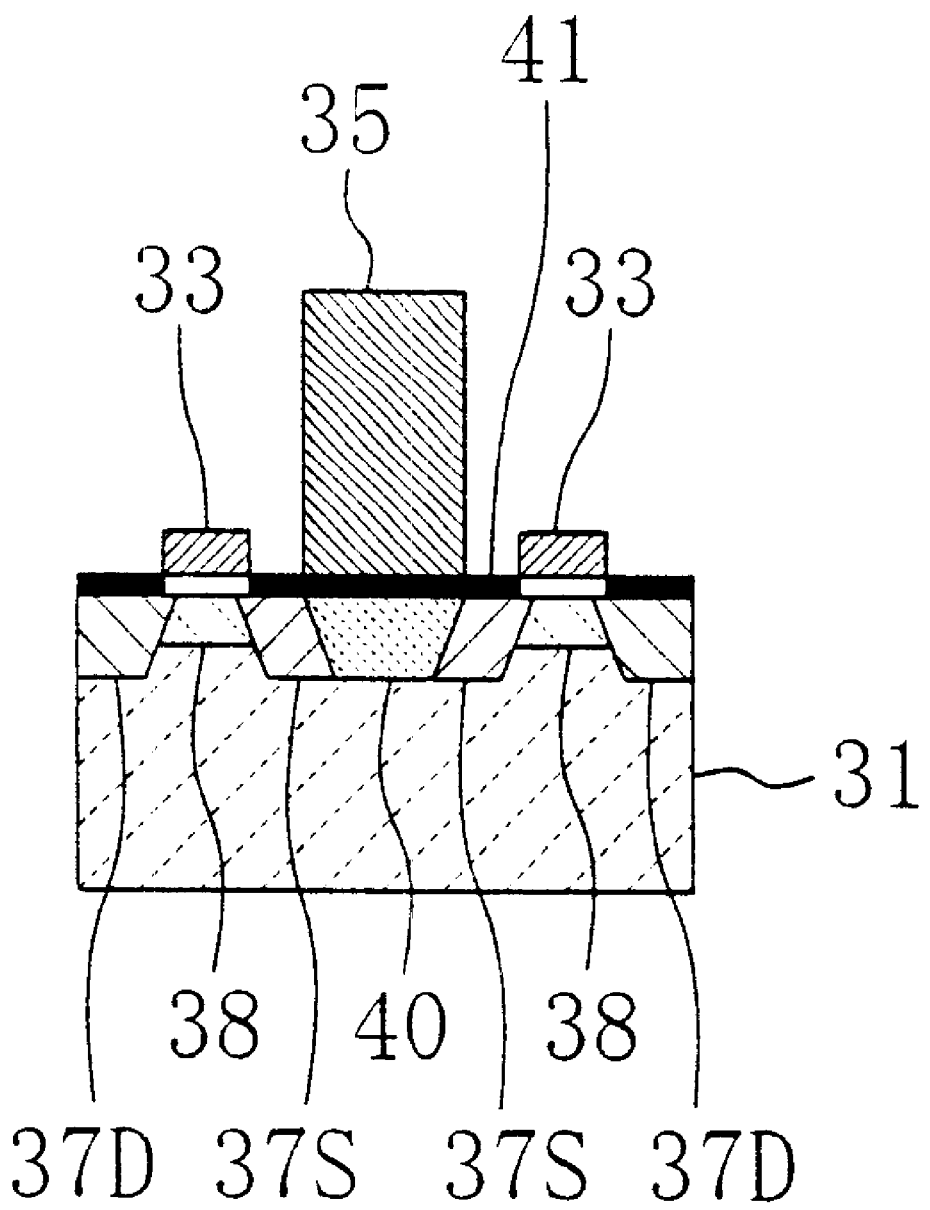
FIG. 14 is a cross-sectional view taken along the line XIV—XIV shown in FIG. 13.
Figure 15:
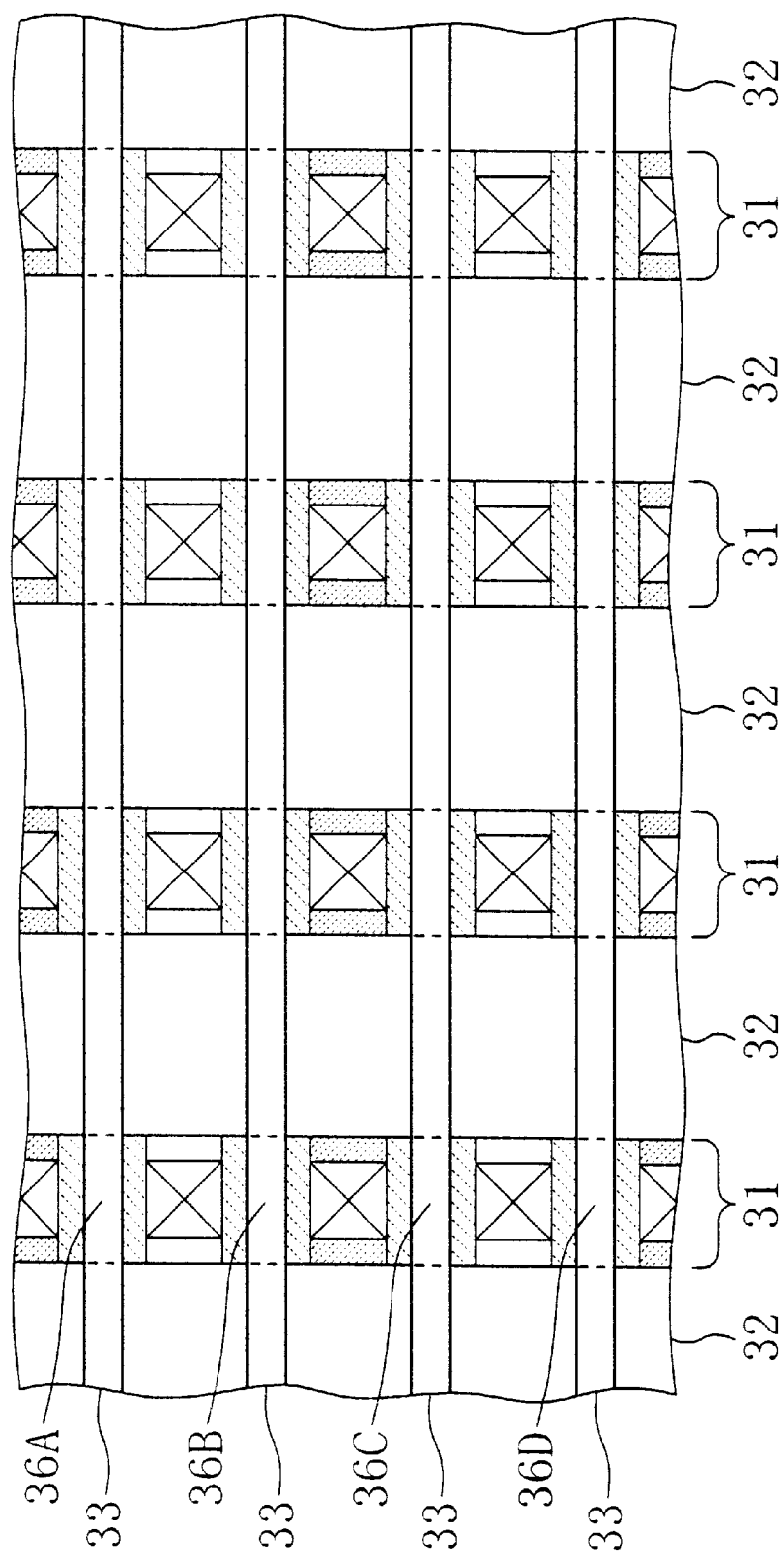
FIG. 15 is a plan view illustrating a layout obtained by removing the bit and source lines from the layout shown in FIG. 13.

Hereinafter, a ferroelectric memory according to a third embodiment of the present invention will be described with reference to FIGS. 13, 14, 15 and 16. FIG. 13 illustrates a planar layout for part of a memory array in the ferroelectric memory of the third embodiment. FIG. 14 illustrates a cross-sectional structure taken along the line XIV—XIV shown in FIG. 13. FIG. 15 illustrates a planar layout obtained by removing the bit and source lines from the layout shown in FIG. 13. And FIG. 16 illustrates a planar layout obtained by removing the word lines from the layout shown in FIG. 15.

Figure 16:
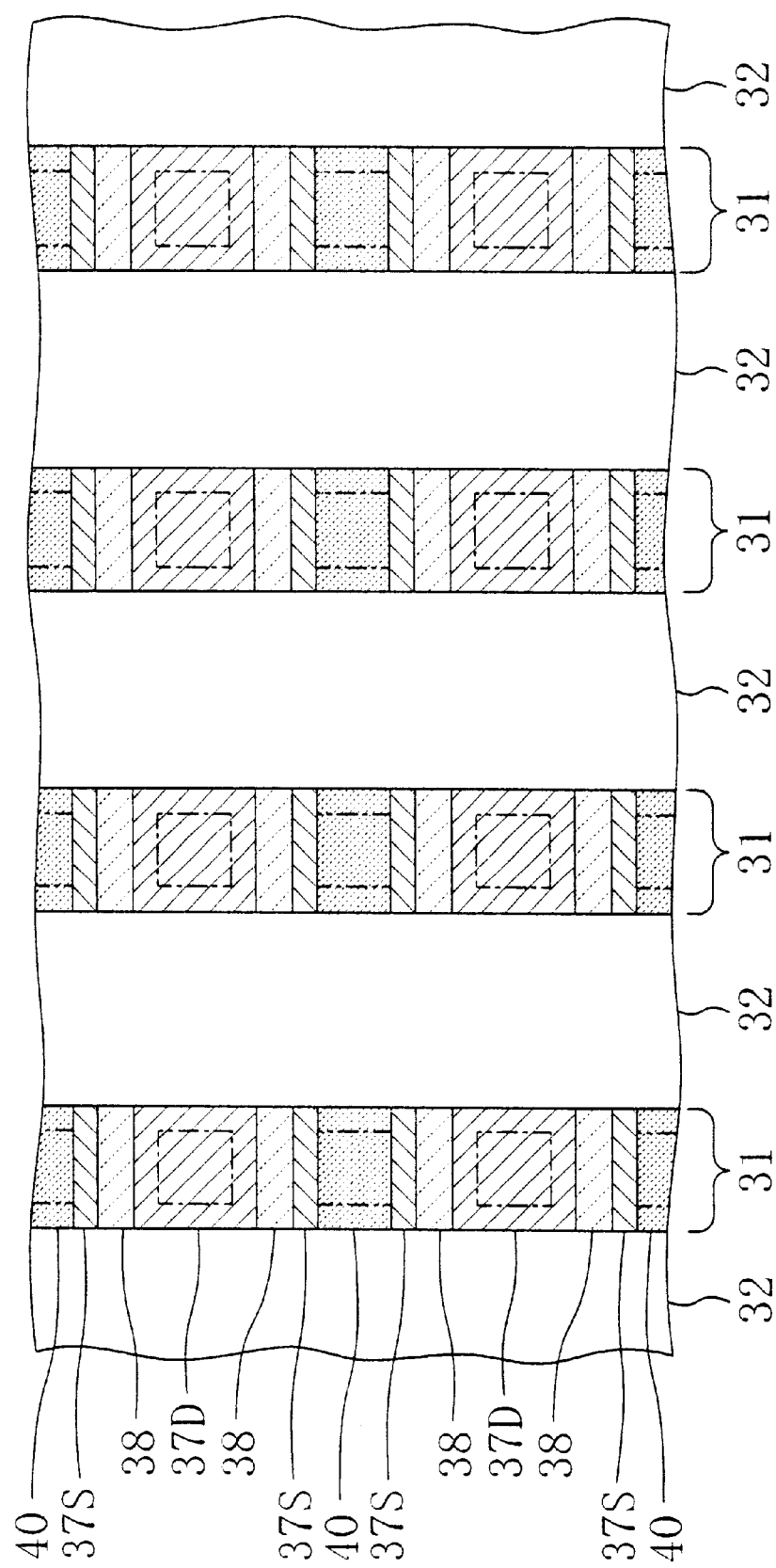
FIG. 16 is a plan view illustrating a layout obtained by removing the word lines from the layout shown in FIG. 15.

As shown in FIGS. 13, 15 and 16, multiple p-well regions 31, extending in one direction and in parallel to each other, are defined in a semiconductor substrate. In addition, multiple well isolating regions 32 are also defined to extend in the same direction and in parallel to each other. In this manner, each of the p-well regions 31 is electrically isolated from horizontally adjacent ones by the associated pair of well isolating regions 32.

As shown in FIGS. 14 and 16, first and second n-type active regions 37S and 37D to be source and drain regions, respectively, are defined on the surface of each p-well region 31. Each pair of n-type active regions 37S and 37D are spaced apart from each other with a channel region 38 interposed therebetween. As shown in FIG. 13, the first active regions 37S, belonging to the same column, are electrically connected to a source line 35 of aluminum, for example, which extends over and along associated one of the well isolating regions 32, via source line contacts. In the same way, the second active regions 37D, belonging to the same column, are electrically connected to a bit line 34 of aluminum, for example, which also extends over and along associated one of the well isolating regions 32, via bit line contacts.

A gate electrode is formed over each channel region 38, which is located between the associated pair of first and second active regions 37S and 37D, with a ferroelectric gate insulating film interposed therebetween. And a word line 33, which extends over the well and well isolating regions 31 and 32 vertically to these regions 31 and 32, is electrically connected to the gate electrodes, belonging to the same row, via word line contacts.

As shown in FIGS. 13 and 15, first, second, third and fourth n-type MFSFETs 36A, 36B, 36C and 36D are formed at intersections between the word lines 33 and each p-well region 31. A ferroelectric insulating thin film, which is formed in the same process step as the gate insulating film for the first through fourth n-type MFSFETs 36A through 36D, is interposed between the p-well and well isolating regions 31, 32 and the word lines 33. However, the insulating film does not have to be formed over the well isolating regions 32.

In the third embodiment, a p-well contact region 40 is defined in the middle of each n-type first active region 37S, and is in contact with the first active region 37S with no isolating region interposed therebetween.

Accordingly, each first active region 37S is divided by the p-well contact region 40 into two sub-regions. Specifically, as shown in FIG. 16, the upper one of the sub-regions 37S is used as the source region for the second n-type MFSFET 36B, while the lower sub-region 37S is used as the source region for the third n-type MFSFET 36C. Also, as in the first embodiment, the first and second n-type MFSFETs 36A and 36B share a second active region 37D and the third and fourth n-type MFSFETs 36C and 36D share another second active region 37D. Thus, the total area of the memory array can be reduced as in the first embodiment.

As shown in FIG. 14, a metal silicide layer 41 is formed on the divided n-type first active region 37S and the well contact region 40, and is connected to the source line 35 via a source line contact. Accordingly, a potential in the first active regions 37S and well contact regions 40 is controllable by changing the voltage applied to the source line 35. The metal silicide layer is formed by turning silicon on the surface of the first active regions 37S and well contact regions 40 into a silicide with a metal such as cobalt or titanium.

In the embodiment illustrated in FIG. 14, the width of the source line contact is approximately equal to that of the well contact region 40 and the source line contact is located just over the well contact region 40. However, neither the width nor the location of the source line contact is limited to the illustrated one.

In the third embodiment, where data should be written on one of the first through fourth MFSFETs 36A through 36D, a voltage is applied through the source line 35 to the well and channel regions 31 and 38 via the metal silicide layer 41 and well contact regions 40. Then, an electric field, having an intensity at least equivalent to the coercive force of the ferroelectric gate insulating film, is applied between the channel regions 38 and the word lines 33 so that the polarization direction of the ferroelectric thin film is reversed. As a result, the data is written on the MFSFET that includes the gate insulating film with the reversed polarization direction.

In the third embodiment, each well contact region 40 is defined in the middle of an associated first active region 37S. Thus, the distance between the well contact region 40 and the well region 31 of the MFSFET on which data should be written can be shortened. As a result, it takes a shorter time to write the data on the MFSFET.

Compared to the first embodiment, the length of the resultant memory array increases in the direction in which the bit lines extend. But the increase in length of the memory array in this direction is not so great. This is because even though the well contact regions 40 are provided in this direction, each of the well contact regions 40 is located in the middle of the associated first active region 37S, i.e., in direct contact with the first active region 37S with no isolating regions interposed therebetween.

Modified Example of Embodiment 3

Figure 17:
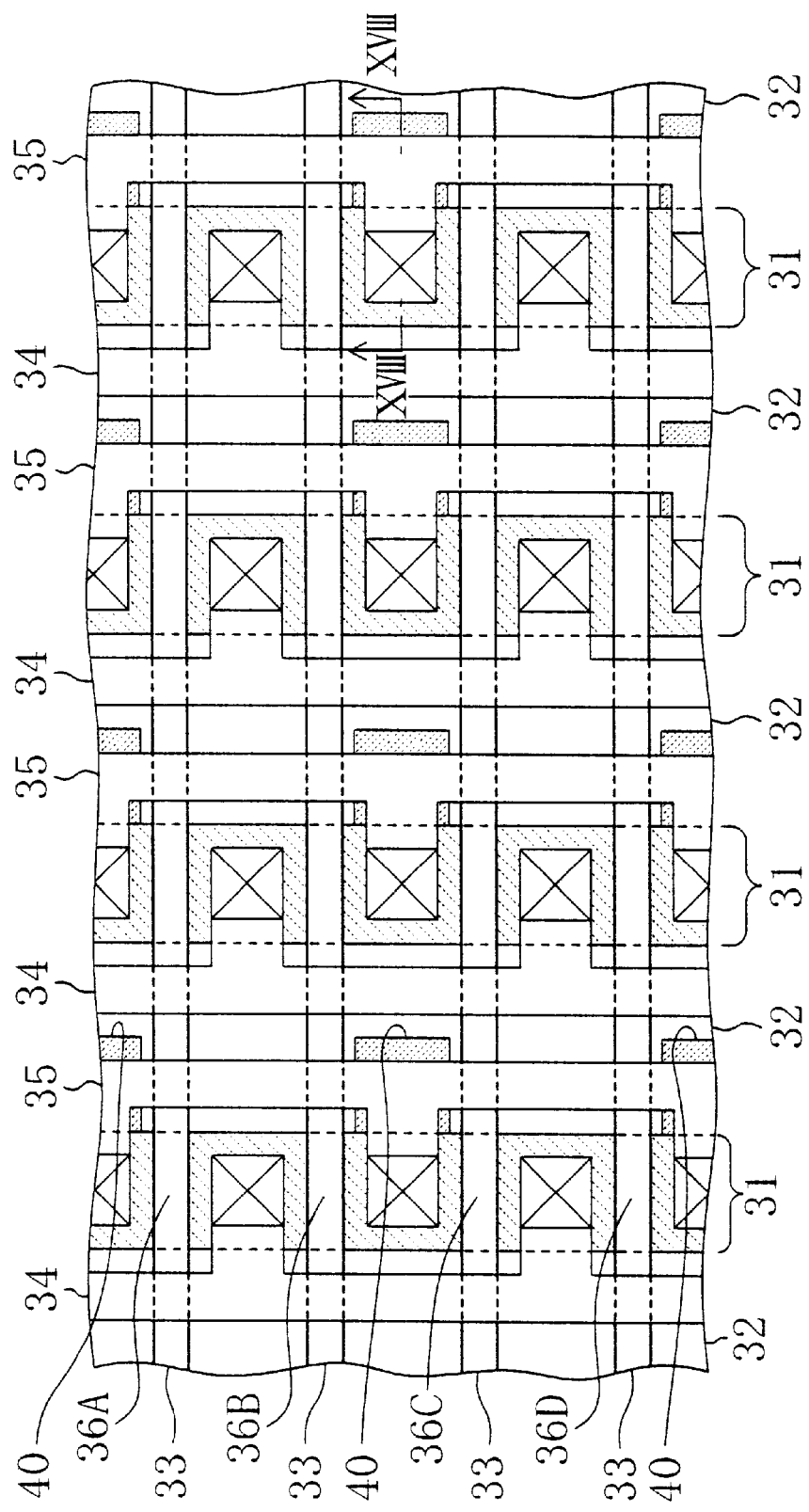
FIG. 17 is a plan view illustrating a layout for part of a memory array in a ferroelectric memory according to a modified example of the third embodiment.
Figure 18:
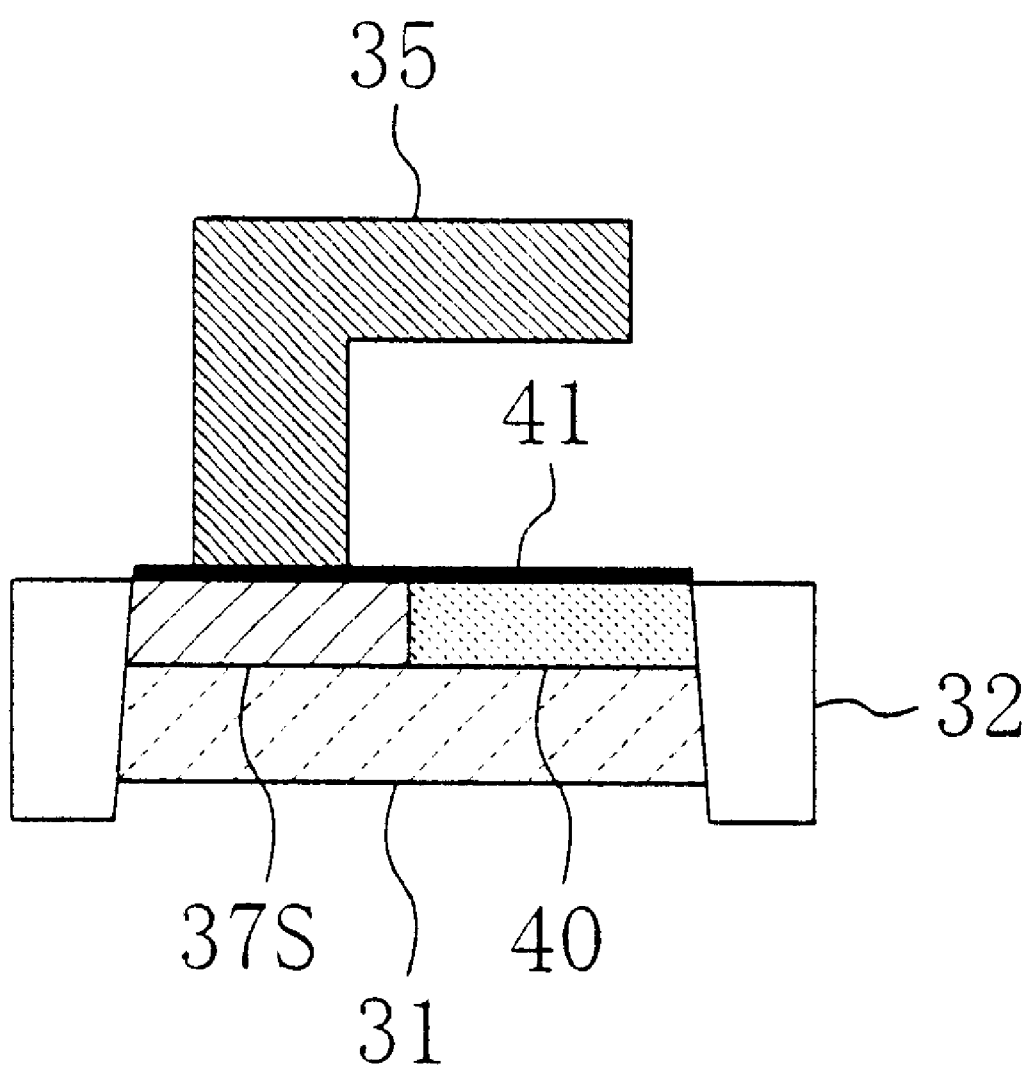
FIG. 18 is a cross-sectional view taken along the line XVIII—XVIII shown in FIG. 17.
Figure 19:
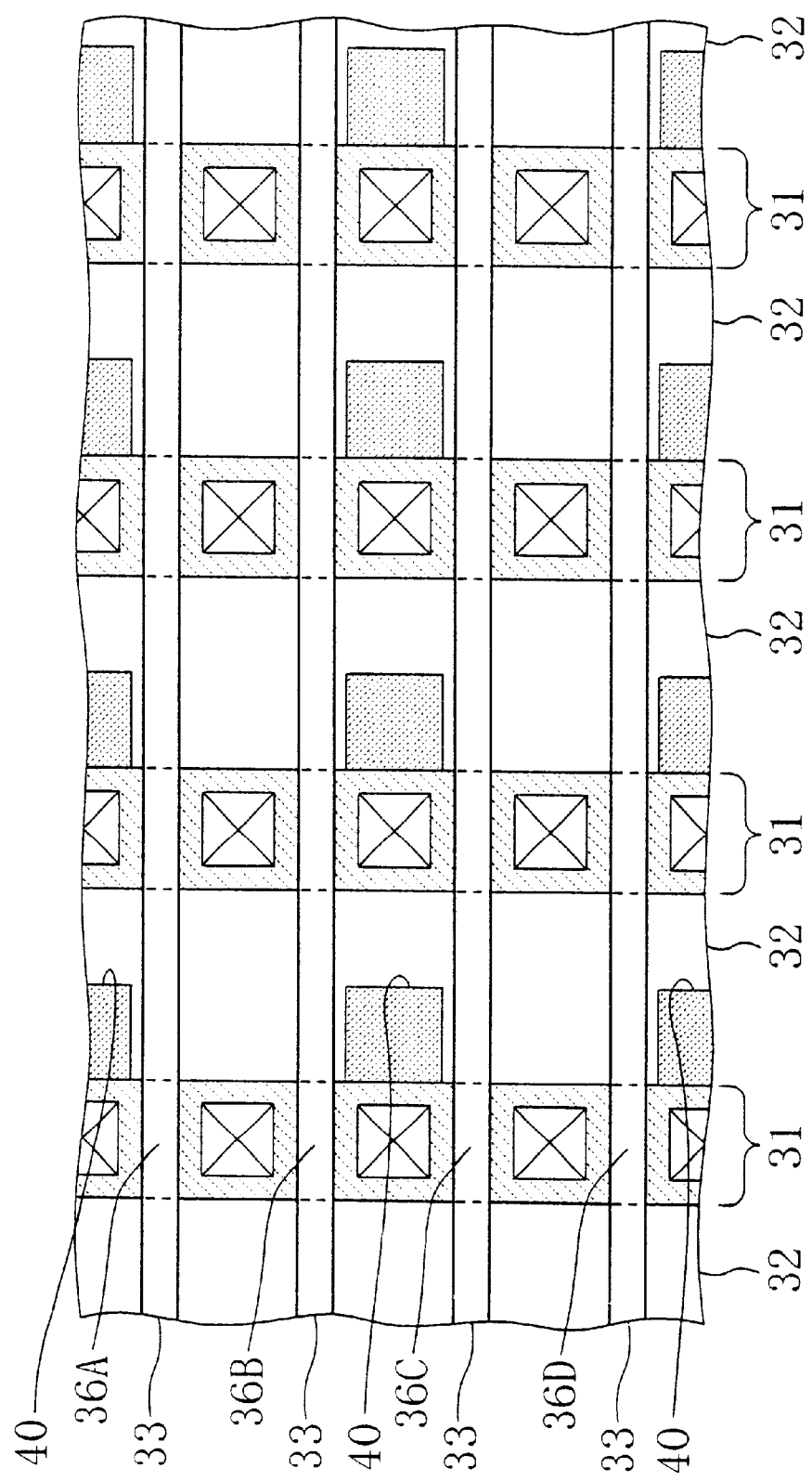
FIG. 19 is a plan view illustrating a layout obtained by removing the bit and source lines from the layout shown in FIG. 17.
Figure 20:
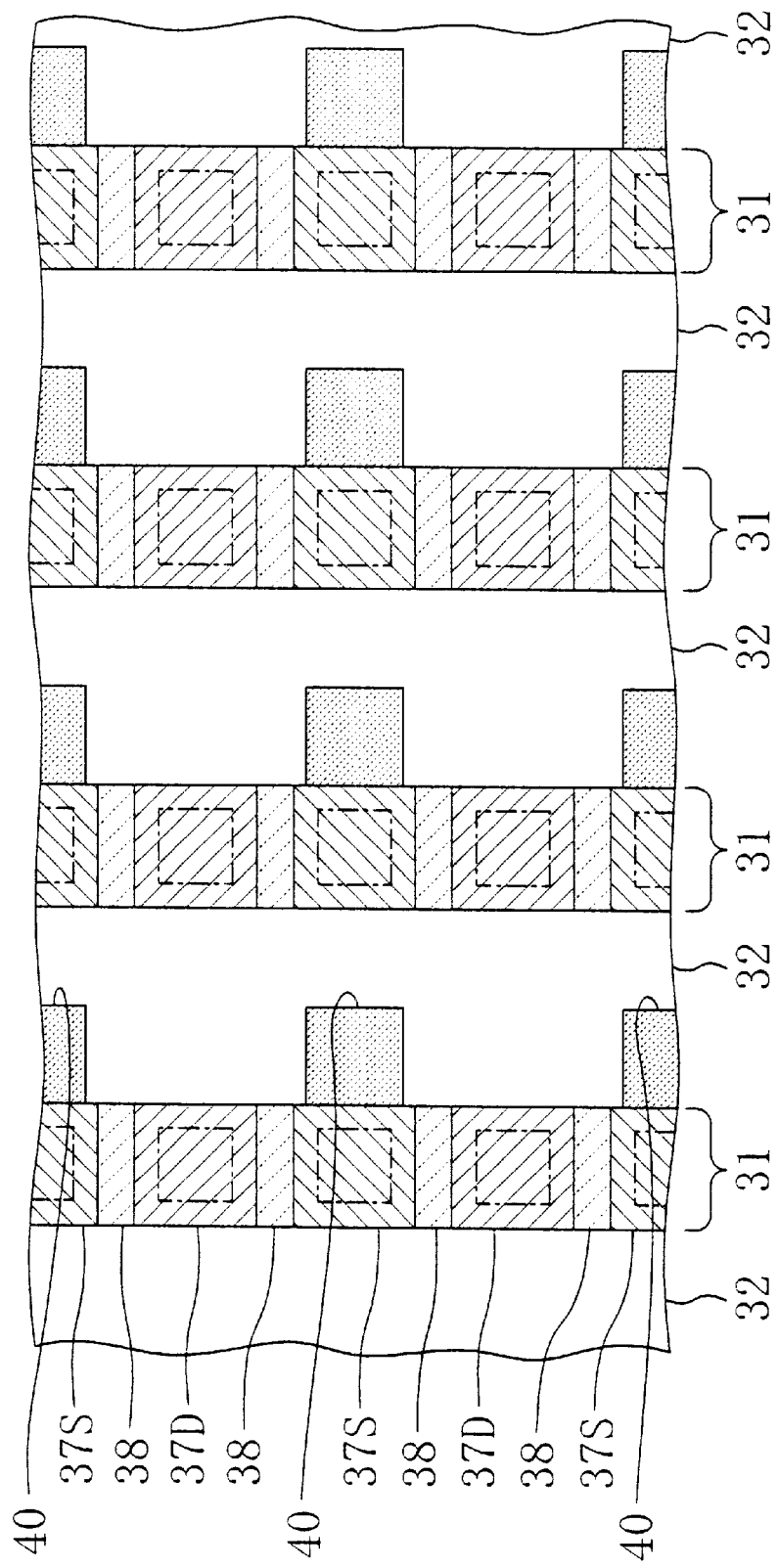
FIG. 20 is a plan view illustrating a layout obtained by removing the word lines from the layout shown in FIG. 19.
Figure 21:
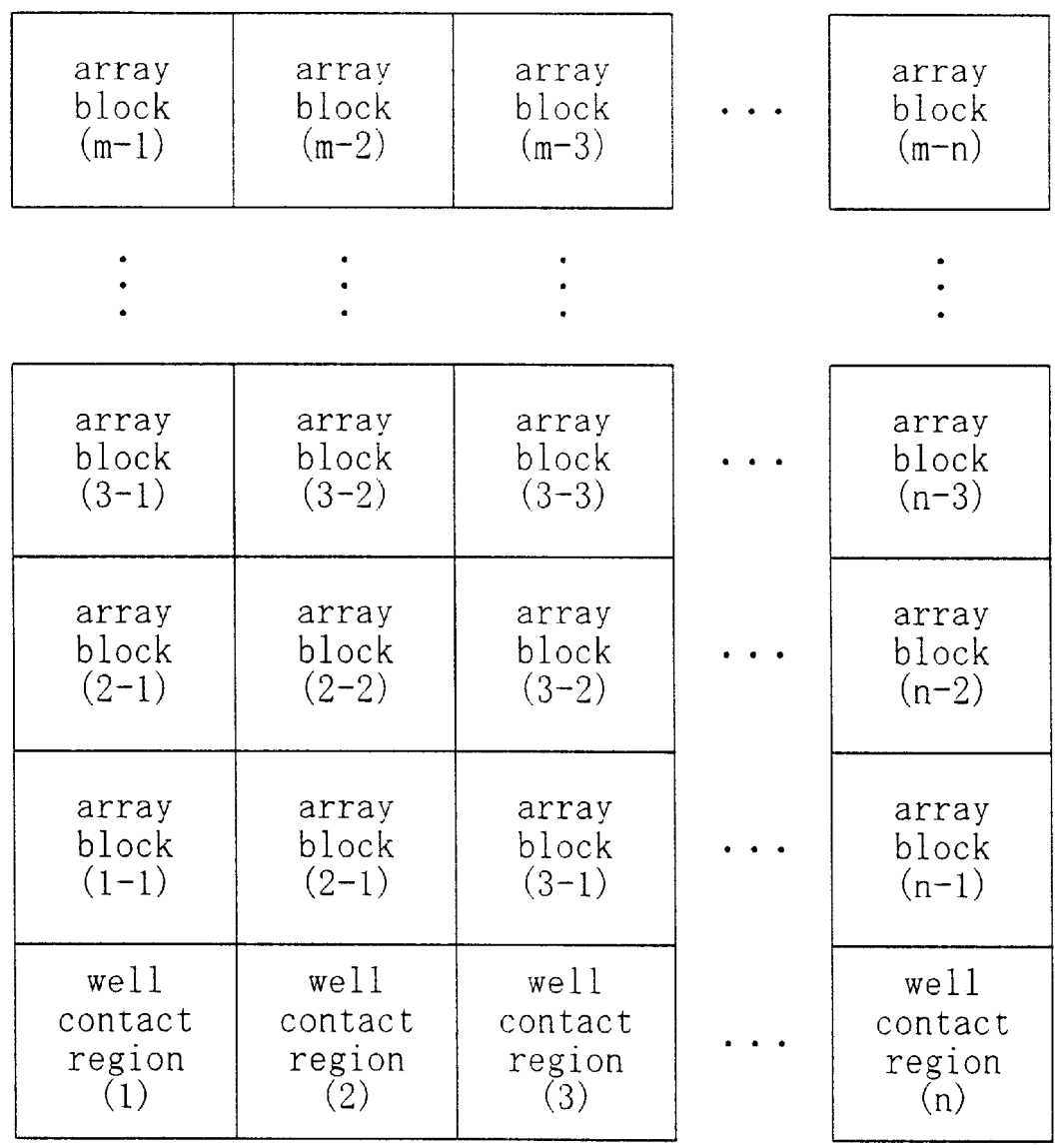
FIG. 21 is a plan view illustrating an overall arrangement for a memory array in a known ferroelectric memory.
Figure 22:
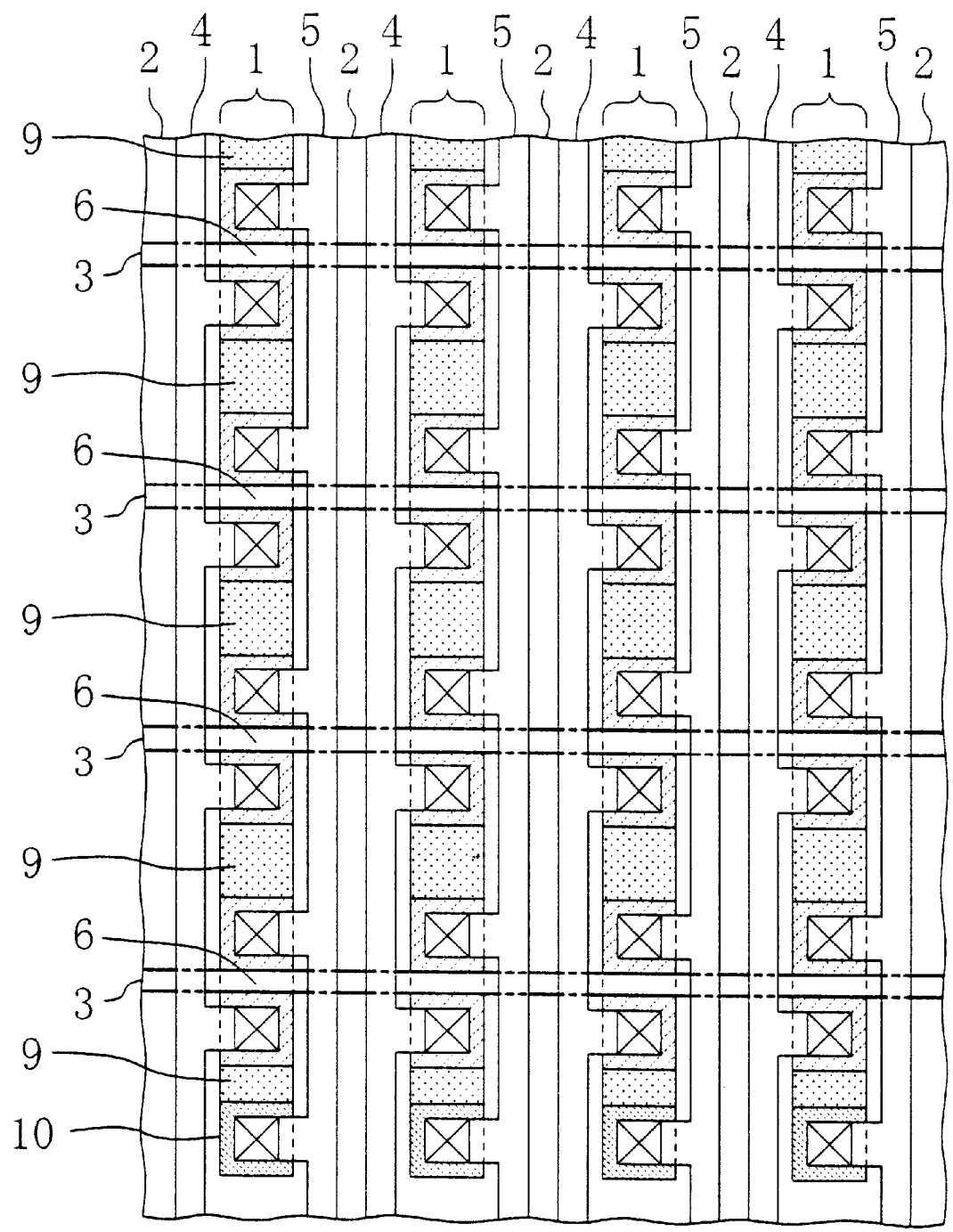
FIG. 22 is a plan view illustrating a layout for part of the memory array in the known ferroelectric memory.
Figure 23:
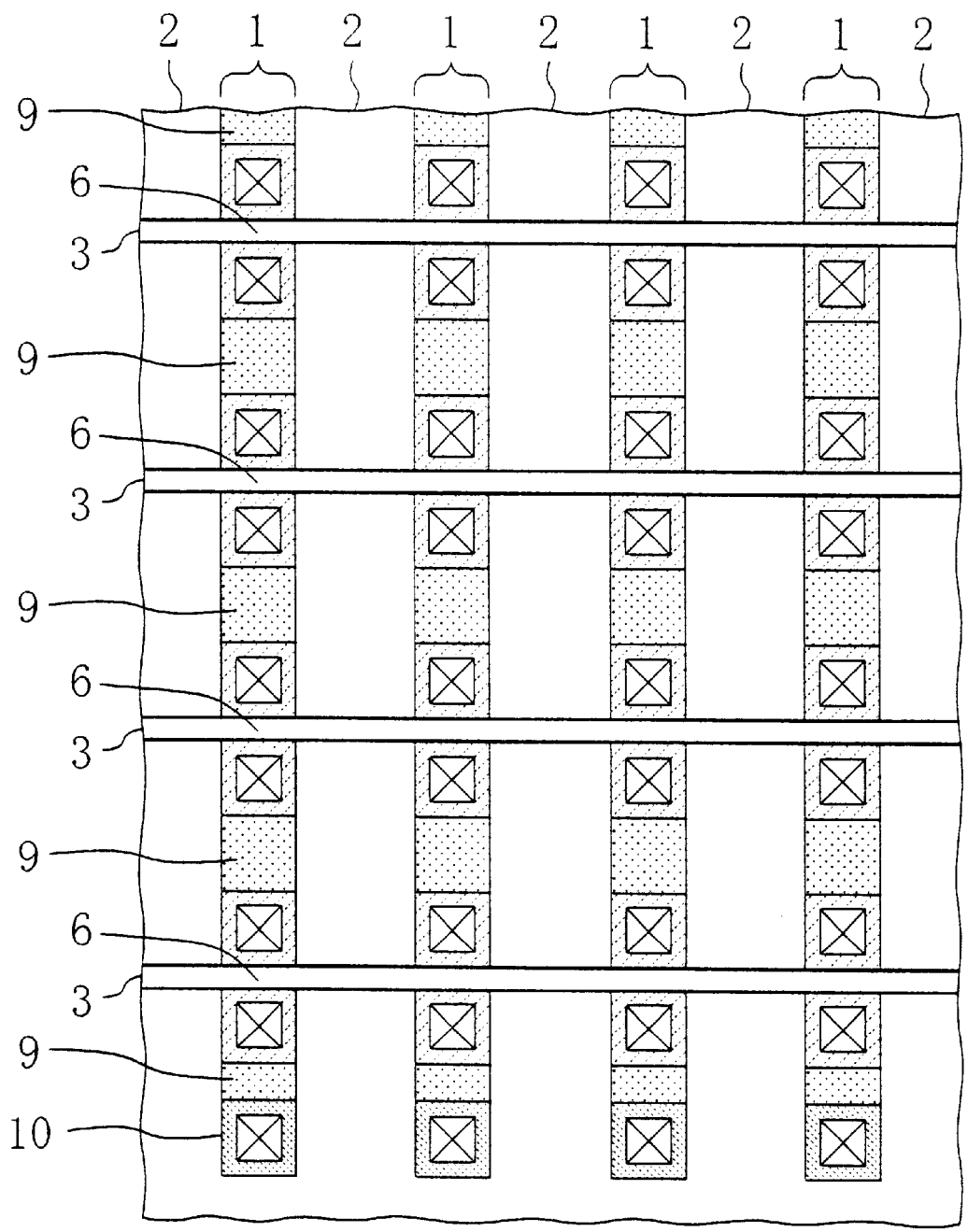
FIG. 23 is a plan view illustrating a layout obtained by removing the bit and source lines from the layout shown in FIG. 22.
Figure 24:
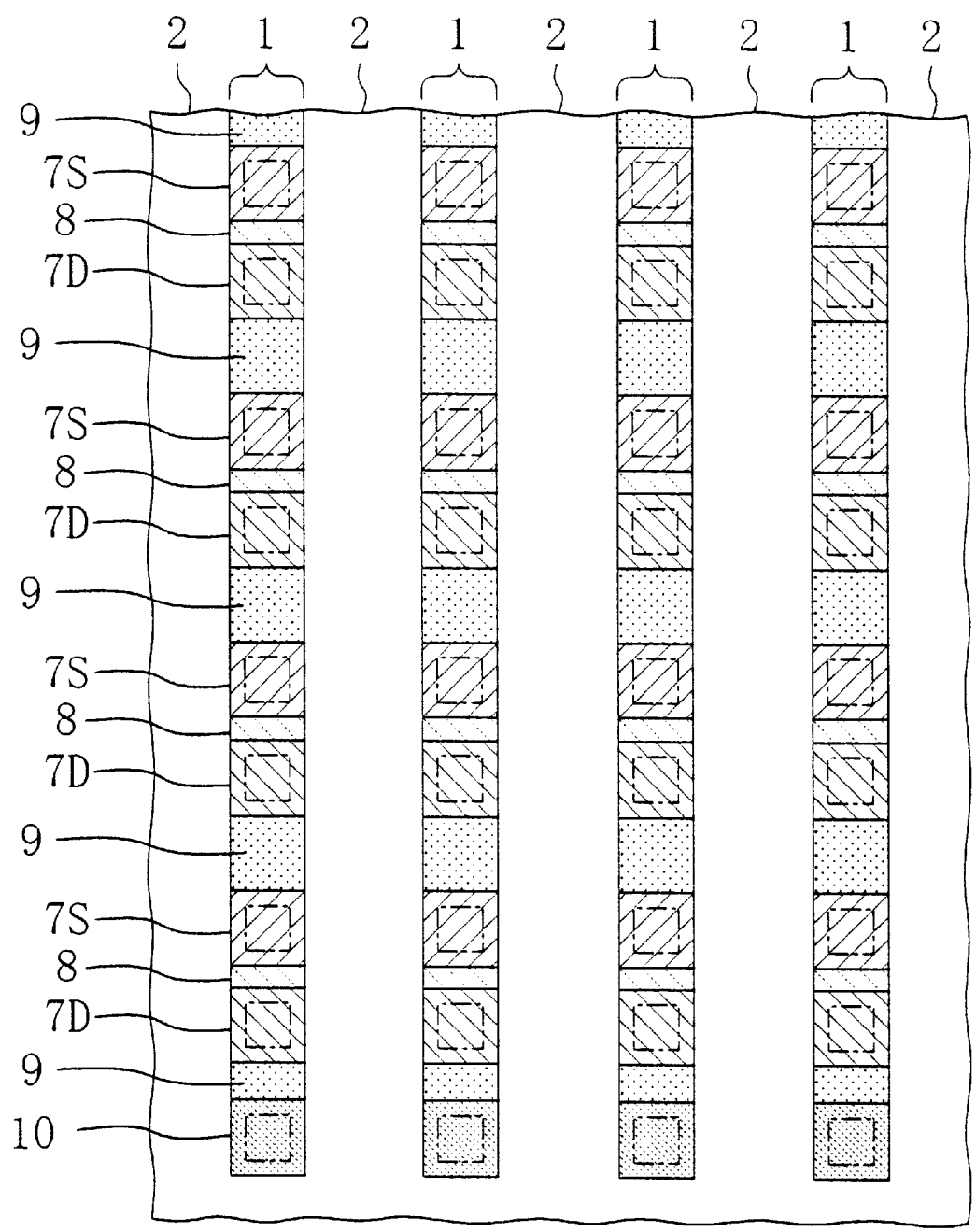
FIG. 24 is a plan view illustrating a layout obtained by removing the word lines from the layout shown in FIG. 23.

Hereinafter, a ferroelectric memory according to a modified example of the third embodiment will be described with reference to FIGS. 17, 18, 19 and 20. FIG. 17 illustrates a planar layout for part of a memory array in the ferroelectric memory of this modified example. FIG. 18 illustrates a cross-sectional structure taken along the line XVIII—XVIII shown in FIG. 17. FIG. 19 illustrates a planar layout obtained by removing the bit and source lines from the layout shown in FIG. 17. And FIG. 20 illustrates a planar layout obtained by removing the word lines from the layout shown in FIG. 19. In this modified example, the same components as the counter-parts of the third embodiment will be identified by the same reference numerals and the description thereof will be omitted herein.

As in the first embodiment, the first through fourth MFSFETs 36A through 36D, which use the same well region 31 in common and are adjacent to each other, share the active region 37S or 37D to be a source or drain region and are not isolated from each other by isolating regions. Thus, the total area of the memory array can be reduced.

In this modified example, each p-well region 31 includes extended regions that extend below the source line 35 from under the n-type first active regions 37S. In addition, well contact regions 40 are formed on the surface of the extended regions so as to come into contact with the first active regions 37S.

As shown in FIG. 18, a metal silicide layer 41 is formed on the n-type first active region 37S and the well contact region 40, which are connected to the source line 35 via a source line contact. The source line contact is formed on a part of the metal silicide layer 41 that is located over the first active region 37S. Accordingly, a potential in the first active region 37S and well contact region 40 is controllable by changing the voltage applied to the source line 35. The metal silicide layer 41 is formed by turning silicon on the surface of the first active region 37S and well contact region 40 into a silicide with a metal such as cobalt or titanium.

In this modified example, where data should be written on one of the first through fourth MFSFETs 36A through 36D, a voltage is applied through the source line 35 to the well and channel regions 31 and 38 via the metal silicide layer 41 and well contact regions 40. Then, an electric field, having an intensity at least equivalent to the coercive force of the ferroelectric gate insulating film, is applied between the channel regions 38 and the word lines 33 so that the polarization direction of the ferroelectric thin film is reversed. As a result, the data is written on the MFSFET that includes the gate insulating film with the reversed polarization direction.

In this modified example, the well contact regions 40 are defined to extend from the first active regions 37S in the direction in which the word lines extend. Thus, the distance between the well region 31 of the MFSFET, on which data should be written, and the nearest one of the well contact regions 40 can be shortened. As a result, it takes a shorter time to write the data on the MFSFET.

Compared to the first embodiment, the length of the resultant memory array increases in the direction in which the word lines extend. But the increase in length of the memory array in this direction is not so great. This is because even though the well contact regions 40 are provided in this direction, each of the well contact regions 40 is in direct contact with the first active region 37S with no isolating regions interposed therebetween.

What is claimed is:

1. A ferroelectric memory comprising:
   a well region, which is defined in a semiconductor substrate and extends in a direction;

a bit line also extending in the direction;

a source line also extending in the direction;

first, second and third memory cells, which are formed in this order on the well region and arranged in the direction;

a first active region for electrically connecting the first memory cell and the bit line together;

a second active region for electrically connecting the first memory cell and the source line together;

a third active region for electrically connecting the second memory cell and the bit line together;

a fourth active region for electrically connecting the second memory cell and the source line together;

a fifth active region for electrically connecting the third memory cell and the bit line together; and a sixth active region for electrically connecting the third memory cell and the source line together, wherein the first and third active regions are the same active region, and wherein the fourth and sixth active regions are the same active region.

2. A ferroelectric memory comprising:

a well region, which is defined in a semiconductor substrate and extends in a direction;

a source line also extending in the direction; and a plurality of well contact regions, which are formed discretely on the surface of the well region and electrically connect the well region and the source line together.

3. A ferroelectric memory comprising:

a well region of a first conductivity type, which is defined in a semiconductor substrate and extends in a direction;

a source line also extending in the direction;

an active region of a second conductivity type, which is formed as a source region on the surface of the well region; and a well contact region of the first conductivity type, which is formed on the surface of the well region, wherein the active region and the well contact region are located adjacent to each other and connected to the source line via a single contact.

* * * * *